(12) United States Patent
Doynov

(10) Patent No.: US 11,689,015 B2
(45) Date of Patent: Jun. 27, 2023

(54) METHOD AND SYSTEMS FOR PROTECTION OF MULTIPORT MULTIMODE POWER OVER ETHERNET DEVICES FROM ELECTROMAGNETIC ENERGY DISTURBANCE

(71) Applicant: Plamen Doynov, Kansas City, MO (US)

(72) Inventor: Plamen Doynov, Kansas City, MO (US)

( * ) Notice: Subject to any disclaimer, the term of this patent is extended or adjusted under 35 U.S.C. 154(b) by 0 days.

(21) Appl. No.: 17/888,107

(22) Filed: Aug. 15, 2022

(65) Prior Publication Data
US 2023/0147803 A1 May 11, 2023

Related U.S. Application Data

(63) Continuation of application No. 17/521,369, filed on Nov. 8, 2021, now Pat. No. 11,451,051.

(51) Int. Cl.
| | |
|---|---|
| *H02H 9/04* | (2006.01) |
| *H02H 5/00* | (2006.01) |
| *H02H 3/08* | (2006.01) |
| *H02H 3/10* | (2006.01) |
| *H02H 3/22* | (2006.01) |

(52) U.S. Cl.
CPC ............. *H02H 9/045* (2013.01); *H02H 5/00* (2013.01); *H02H 5/005* (2013.01); *H02H 9/04* (2013.01); *H02H 3/08* (2013.01); *H02H 3/105* (2013.01); *H02H 3/22* (2013.01); *H02H 9/041* (2013.01); *H02H 9/046* (2013.01)

(58) Field of Classification Search
CPC ............ H02H 9/045; H02H 5/00; H02H 9/04; H02H 3/08; H02H 9/046; H02H 3/22; H02H 3/105; H02H 9/041; H02H 5/005; H02H 3/20; H01C 7/12; H01C 8/04
USPC .................................................. 361/117–119
See application file for complete search history.

(56) References Cited

U.S. PATENT DOCUMENTS

| | | | |
|---|---|---|---|
| 2008/0037188 A1* | 2/2008 | Wilson | H04L 12/10 361/56 |
| 2016/0043544 A1* | 2/2016 | Naughton | H03K 5/2463 361/56 |

\* cited by examiner

*Primary Examiner* — Danny Nguyen
(74) *Attorney, Agent, or Firm* — Dale J. Ream

(57) ABSTRACT

A method and system for suppressing EMP-induced voltage surges due to detonation of a nuclear weapon at high altitude generating an EMP (HEMP) comprising E1, E2, and E3 component pulses. Surge protection assemblies are positioned intermediate a signal stream and a plurality of electronic device ports associated with a plurality of communication channels of networked devices. Single-channel multimode surge suppressing systems are combined to form multi-port multimode protection systems that connect directly to multiport networked devices supporting communication channels with mixed signals data and direct current power in Gigabit Ethernet networks supporting PoE. The surge suppressing systems mitigate differential and common mode induced interference and protect from overvoltage surges associated with E1, E2, and E3 components of the HEMP and mitigate the over-voltages to predetermined allowable levels within the predetermined time. The surge suppressing systems is interoperable with multimode PoE and support endpoint and midspan PoE devices of Gigabit networks.

32 Claims, 14 Drawing Sheets

Early time HEMP (E1)

$E_1(t) = 0$ for $t \leq 0$
$E_1(t) = E_{01}\ k_1\ [e^{a_1 t} - e^{b_1 t}]$ for $t > 0$
where $E_{01}$ = 50,000 V/m,
$a_1 = 4 \times 10^7$ s$^{-1}$,
$b_1 = 6 \times 10^8$ s$^{-1}$, and
$k_1 = 1.3$

Intermediate time HEMP (E2)

$E_2(t) = 0$ for $t \leq 0$
$E_2(t) = E_{02}\ k_1\ [e^{a_2 t} - e^{b_2 t}]$ for $t > 0$
where $E_{02}$ = 100 V/m,
$a_2 = 1 \times 10^3$ s$^{-1}$,
$b_2 = 6 \times 10^8$ s$^{-1}$, and
$k_2 = 1.0$

Late time HEMP (E3)

$E3(t) = E_i(t) + E_j(t)$ $E_i(t) = 0$ for $\tau \leq 0$
$E_i(t) = E_{0i}\ k_1\ [e^{a_i \tau} - e^{b_i \tau}]$ for $\tau > 0$
where $\tau = t - 1$, $E_{0i}$ = 0.04 V/m,
$a_i = 0.02$ s$^{-1}$, $b_i = 2$ s$^{-1}$, and
$k_i = 1.058$ $E_j(t) = 0$ for $\tau \leq 0$
$E_j(t) = E_{0j}\ k_1\ [e^{a_j \tau} - e^{b_j \tau}]$ for $\tau > 0$
where $\tau = t - 1$, / $E_{0j}$ = 0.01326 V/m,
$a_j = 0.015$ s$^{-1}$, $b_j = 0.02$ s$^{-1}$, and
$k_j = 9.481$

FIG. 6

| Standard Parameter | Bell Labs (1960s) DEXP | IEC-77C (1993) DEXP | Leuthauser (1994) QEXP | VG95371-10 (1995) DEXP | IEC 61000-2-9 (1996) DEXP |
|---|---|---|---|---|---|
| t10%-90% | 4.6 ns | 2.5 ns | 1.9 ns | 0.9 ns | 2.5 ns |
| Peak Field $E_o$ | 50 kV/m | 50 kV/m | 60 kV/m | 65 kV/m | 50 kV/m |
| FWHM | 18.4 ns | 23 ns | 23.8 ns | 24.1 ns | 23 ns |
| constant | 1.05 | 1.3 | 1.08 | 1.085 | 1.3 |
| α (1/sec) | 4x10$^6$ | 4x10$^7$ | 2.20x10$^9$ | 3.22x10$^7$ | 4x10$^7$ |
| β (1/sec) | 4.76x10$^8$ | 6x10$^8$ | 3.24x10$^7$ | 2.07x10$^9$ | 6x10$^8$ |
| Energy Density | 0.891 J/m$^2$ | 0.114 J/m$^2$ | 0.167 J/m$^2$ | 0.196 J/m$^2$ | 0.114 J/m$^2$ |

FIG. 7

| IEC E1 HEMP Waveform Properties ||
|---|---|
| Characteristic | Value |
| Waveform peak | $E_{peak} = 50,000 \text{ V/m}$ |
| Spectrum peak | $E_{low\,freq} = 0.00152 \text{ V/m/Hz}$ |
| Waveform peak power | $P_{peak} = 6.64 \times 10^6 \text{ W/m}^2$ |
| Spectrum peak power | $P_{low\,freq} = 6.11 \times 10^{-9} \text{ W/m}^2/\text{Hz}$ |
| Total energy | $W_{total} = 0.115 \text{ J/m}^2$ |
| Time of peak | $t_{peak} = 4.84 \text{ ns}$ |
| Rise time, 10% to 90% of peak | $t_{10-90} = 2.47 \text{ ns}$ |
| Pulse width, full width at half maximum | $FWHM = 23.0 \text{ ns}$ |
| Pulse width, total energy over peak power | $W_{total} / P_{peak} = 17.3 \text{ ns}$ |
| Spectrum width, total energy over peak spectrum power | $W_{total} / P_{low\,freq} = 18.8 \text{ MHz}$ |

FIG. 8

| Type | IEEE Standard | PD Min. Power Per Port [W] | PSE Max. Power Per Port [W] | Cable Category | PoE # Pairs/Class | Released Time |
|---|---|---|---|---|---|---|
| 1 | 802.3af | 12.95 | 15.4 | CAT5e | 2 | 2003 |
| 2 | 802.3at | 25 | 30 | CAT5e | 2 | 2009 |
| 3 | 802.3bt | 51-60 | 60 | CAT5e | 2 / 0 – 4<br>4 / 5 - 6 | 2018 |
| 4 | 802.3bt | 71-90 | 100 | CAT5e | 4 / 7 - 8 | 2018 |

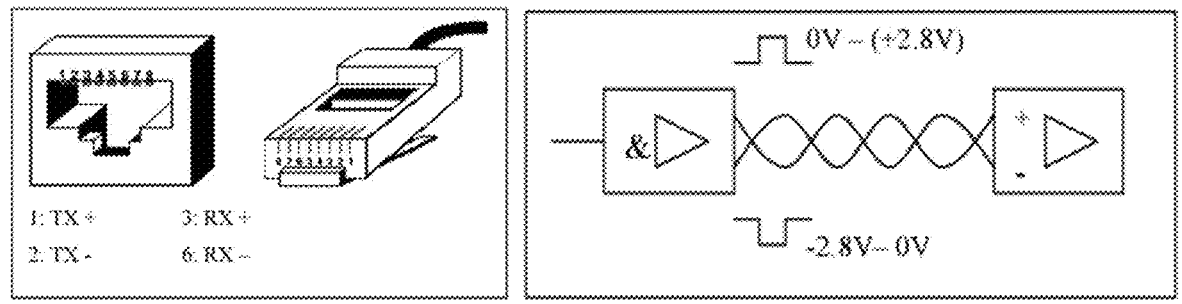

FIG. 16

| Pins at switch | T568A color | T568B color | 10/100 mode B, DC on spares | 10/100 mode A, mixed DC & data | | 1000 (1 gigabit) mode B, DC & bi-data | | 1000 (1 gigabit) mode A, DC & bi-data | |
|---|---|---|---|---|---|---|---|---|---|
| Pin 1 | White/green stripe | White/orange stripe | Rx + | Rx + | DC + | TxRx A + | | TxRx A + | DC + |
| Pin 2 | Green solid | Orange solid | Rx - | Rx - | DC + | TxRx A - | | TxRx A - | DC + |
| Pin 3 | White/orange stripe | White/green stripe | Tx + | Tx + | DC - | TxRx B + | | TxRx B + | DC - |
| Pin 4 | Blue solid | Blue solid | DC + | Unused | | TxRx C + | DC + | TxRx C + | |
| Pin 5 | White/blue stripe | White/blue stripe | DC + | Unused | | TxRx C - | DC + | TxRx C - | |
| Pin 6 | Orange solid | Green solid | Tx - | Tx - | DC - | TxRx B - | | TxRx B - | DC - |
| Pin 7 | White/brown stripe | White/brown stripe | DC - | Unused | | TxRx D + | DC - | TxRx D + | |
| Pin 8 | Brown solid | Brown solid | DC - | Unused | | TxRx D - | DC - | TxRx D - | |

FIG. 17

PCB traces routing for differential signal

Microstrip　　　　　　　　Strip line

A – single trace width
S – space between differential pair traces
D – distance to neighboring differential pair traces

METHOD AND SYSTEMS FOR PROTECTION OF MULTIPORT MULTIMODE POWER OVER ETHERNET DEVICES FROM ELECTROMAGNETIC ENERGY DISTURBANCE

REFERENCE TO RELATED APPLICATIONS

This application claims the priority of non-provisional patent application Ser. No. 17/521,369 filed on Nov. 8, 2021, titled Method and Systems for Protection of Electrical Multiports from Electromagnetic Pulse Using Impedance Matching and Low Insertion Loss Design, which claims the priority art of non-provisional patent application Ser. No. 17/148,168 filed on Jan. 13, 2021, titled Method and Systems for Detection and Protection From Electromagnetic Pulse Events Using Hardware Implemented Artificial Intelligence (now U.S. Pat. No 11,714,483), which claims the priority art of non-provisional patent application Ser. No. 16/925,600 filed Jul. 10, 2020 (now U.S. Pat. No. 10,938,204), titled Method for Detecting an Isolating an Electromagnetic Pulse for Protection of a Monitored Infrastructure, which claims the priority of non-provisional patent application Ser. No. 16/597,427 filed Oct. 9, 2019, (now U.S. Pat. No. 10,742,025), titled System and Method for Detecting an Isolating an Electromagnetic Pulse for Protection of a Monitored Infrastructure, which claims the priority of non-provisional patent application Ser. No. 16/240,897 filed Jan. 7, 2019 (now U.S. Pat. No. 10,530,151), titled System and Method For Suppressing Electromagnetic Pulse-Induced Electrical System Surges, which claims the benefit of provisional patent application U.S. Ser. No. 62/615159 filed Jan. 9, 2018 titled System and Method For Suppressing Electromagnetic Pulse-Induced Electrical System Surges, all of which are incorporated in their entirety herein by reference.

BACKGROUND OF THE INVENTION

This invention relates generally to mitigating the impending effects of excessive electromagnetic energy on Ethernet communication channels, including Power over Ethernet (PoE), and preventing damage to the connected electrical and electronic infrastructure and systems. Electromagnetic energy surges are phenomena where over-voltages and current spikes occur for a short period of time. The sources of powerful surges are electrical grid circuit switching, natural lightning strikes, electromagnetic interference (EMI) coupling, electrostatic discharge (ESD), nuclear electromagnetic pulses (NEMP), non-nuclear EMP (NNEMP) based on high-power electromagnetic (HPEM), ultra-wide band (UWB) directed energy weapons (DEW) sources, and geomagnetic disturbance (GMD), as summarized in FIG. 1. The sources based on natural phenomena or technology-based sources for intentional EMI can impose devastating effects on electrical and electronic infrastructure. To prevent or minimize the damage due to surge events and associated electromagnetic disturbance, proper installation of protection and grounding system is essential to suppress the surge, absorb the energy, and/or redirect the energy to ground.

The term electromagnetic pulse (EMP) is used to describe a transient burst of electromagnetic (EM) energy and the associated electromagnetic disturbances due to energy coupling to conductive surfaces and lines. In this document, the term "EMP" is used to describe the electromagnetic fields generated by natural or manmade sources. Frequently, the term High-altitude Nuclear EMP (HNEMP) is also used. The terms "EMP" or "HEMP" as used herein refer to the electromagnetic pulse generated by a weapon such as a nuclear bomb detonation, directed energy system for high-power EM generation, other devices for intentional EM interference (IEMI) or natural EMP events such as Coronal Mass Ejection (CME), supernova explosion, and other cosmic phenomenon resulting in Geomagnetic Disturbance (GMD) and large scale EMP effects.

In time domain, the EMP is presented with a waveform that describes how the amplitude of the pulse changes in time. Several specific parameters correlate the waveform to the intensity of the EMP. The real EM pulses tend to vary and be quite complex, so their simplified descriptions are typically characterized by:

The type of energy coupling-radiated EM (direction of propagation, polarization, etc.), conducted, electric, magnetic, etc.

Pulse waveform: shape (rise and fall time), pulse width at half maximum (PWHM), duration, and peak amplitude The range or spectrum of frequencies present and the power spectrum distribution (in frequency domain).

Any EMP is associated with electromagnetic interference (EMI) which is related to the frequency content and spectral distribution and is classified as "narrowband", "wideband" and "ultrawideband" distributed in different frequency ranges. The frequency spectrum and the pulse waveform in time domain are interrelated analytically via the Fourier transform and other mathematical transformations for joint time-frequency representation (wavelets, spectrograms, etc.). An EMP typically contains energy at many frequencies from direct current (DC) to some upper limit depending on the source. Withing the bandwidth there could be multiple spectral peaks with high magnitudes. In general, the shorter the pulse (which also implies a short rise time) the broader the spread over a range of frequencies. The commonly used first-order approximation is $f_h = 0.35/\tau_r$, where $f_h$ is the high frequency range (Hz) and $\tau_r$ is the rise time of the pulse (sec) from 10% to 90% of its peak amplitude.

FIG. 2 is a pictograph of an electromagnetic pulse generated by high-altitude nuclear explosion in the atmosphere. In addition to the figures which are directly pertinent to this invention, FIG. 2 to FIG. 10 are included to supplement the description of the physical phenomena that result in the extreme magnitude and intensity of EMPs, their modeling and coupling simulation.

In general, the interactions of the high-energy gamma rays with atoms in the atmosphere produce electrons which interact with the Geo-magnetic field producing EM field with a Poynting vector from the burst source towards the Earth's surface. The field generated by a high-altitude EMP (HEMP) has direction variation along a north-south central line and over the horizon extended effects, as illustrated in FIG. 3, which is a pictograph of HEMP and the Electromagnetic Field (EMF) Poynting vector direction with respect to the observer's location. The intensity of the pulse varies by location (latitude) due to the Geo-magnetic field distribution. Some additional relevant factors will be discussed further while the detail specifics of the related physical phenomena are beyond the scope of this application.

An EMP event is capable of inducing voltages and corresponding currents into different electrical systems. The voltage/current magnitudes depend on the coupling of the EM field with the system (its susceptibility) and the characteristics of the EM wave (direction, polarization, frequency content, and others). The long and exposed transmission lines of wide-area power distribution grids, as well as the electrical systems of localized mini-grids, renewable energy systems, communication lines, homes' wiring, commercial buildings, and even vehicle electrical systems. FIG. 4 illustrates the coupling of the EM energy into a transmission line at height h above the ground. The image displays a few key relations of the Electric field (E) and Magnetic field (B) using the Half-space Earth model. The image is from "The Early-time (E1) HEMP and its impact on the US Power Grid" report, written in 2010 by Savage et al., Metatech Corp., and provides an excellent analysis of the physical phenomena associated with the HEMP.

Without proper protection measures, over-voltage surges can disturb, damage, or destroy components within the electrical systems in the area of impact, diminishing the operability of the electrical system or rendering it unusable until repaired. Persistent and successful protection is possible only with implementation of adequate surge shielding (e.g., Faraday cage) and/or surge limiting and energy absorbing methods. For example, multiple methods and tools are developed and used for surge protection from EM energy associated with lightning. While the duration of a lightning strike appears very short (microseconds, $10^{-6}$ s), it is orders of magnitude longer than the duration of what is known in the literature as the E1 HEMP (nanoseconds, $10^{-9}$ s). In addition, as seen in FIG. 2, due to its origin, a HEMP will induce effects in a very large area. Similarly, it is understood that a massive solar mass ejection (CME) reaching the Earth imposes GMD which has damaging effects on electrical infrastructure.

Unlike the electromagnetic radiation or pulse associated with common natural phenomena (lighting strikes, transmission lines overvoltage, and overcurrent surges, etc.), the HEMP comprises of more complex time and frequency domain characteristics. The HEMP is described with several stages in time following the nuclear blast. They are also known as HEMP phases or pulses of varying waveform (magnitude, duration, frequency content, etc.). Therefore, the HEMP is more accurately considered as a complex, electromagnetic multi-pulse event, usually described in terms of sequence of three primary components defined by the International Electrotechnical Commission (IEC) as E1, E2, and E3 phases of the high-altitude EMP (HEMP). The characteristics of these phases (pulses) of HEMP are further described in this application. The relative electric field strength of the time sequence is displayed in FIG. 5A and FIG. 5B using logarithmic scales for E (V/m) vs Time (s). Some of the commonly used analytical expressions for the HEMP E1, E2, and E3 waveforms are given in FIG. 6, which presents the analytical expressions for the waveforms.

Starting in the 1960s, multiple waveform descriptions have been developed in order to model the associated hazardous effects. A series of standards related to the description of the associated waveforms and known as IEC 77C Standards. The evolution of the unclassified standards with respect to the E1 HEMP environment can be seen in the Table in FIG. 7, which displays the evolution of the waveform parameters of the unclassified HEMP E1 environment Standards. Some additional details of the associated pulse waveform characteristics are given in the Table in FIG. 8. As can be seen from the Table in FIG. 7, the most common analytical expressions for E1 HEMP are the Difference of double exponential (DEXP) and the Quotient of exponentials (QEXP). The plots of DEXP and QEXP in time domain and their respective spectral distribution in frequency domain are presented in FIG. 9A. The Double Exponential (DEXP) the Quotient Exponential (QEXP) are most frequently used for modeling. FIG. 9B displays the waveform of the E2 HEMP and its analytical expression. FIG. 9C displays the waveforms associated with the two phases of E3 HEMP. Additional analytical expressions and models have been developed but they are beyond the scope of this application.

The damage to electrical and electronic devices is determined by the amount of energy that is transferred to devices in the electromagnetic environment and all electrical or electronic equipment is susceptible to the malfunctions and permanent damage under the electromagnetic radiation of sufficient intensity. The plots in FIG. 10 illustrate the power spectrum density (V/m-Hz) associated with a HEMP E1, an atmospheric lightning, and IEMI (high-power microwave, high-intensity RF).

The level of system vulnerability is dependent on the intensity of the EMF and the coupling of the external fields to the electrical circuits and the sensitivity characteristics of circuits components. A temporary malfunction (or upset) can occur when an electromagnetic field induces current(s) and voltage(s) in the operating system electronic circuits at levels that are comparable to the normal operational rating characteristics. Regardless the source of EMI, two principal radiation coupling modes are recognized in the literature and the relevant standards assessing how much radiated power is coupled into target systems: (1) "front door" coupling, (FDC), and (2) "back door" coupling, (BDC). The FDC is typically observed when the power radiated from the RF/HPM source is directly coupled into the electronic systems. The antenna subsystem is designed to receive and transmit RF signals, and thus providing an efficient path for the energy flow from the electromagnetic source to enter the equipment and cause damage especially when the antenna's bandwidth is withing the frequency range of the source. As seen in FIG. 10, the HEMP E1 has a very broad bandwidth. The higher frequencies (shorter wavelength) couples better via small apertures.

The BDC occurs when the electromagnetic field from the source produces large transient voltage/currents or the EM waves propagate and couple through the gaps, small apertures, fixed electrical wiring and interconnecting cables, connections to the power mains, communication cables, network and telephone coper wires, unshielded sections, and others. The BDC can generally be described as a wide-range interference at specific narrow-band susceptibility characteristics because of existing apertures and modes of coupling to cables.

Since the impinging EMP field has a broad frequency spectrum and a high field strength, the antenna response must be considered both in and out of the antenna's band. The inadvertent, unintended, or parasitic antennae are electrically penetrating conducting structures, power lines, communication cables, and others that collect EMP energy and allow its entry into a building, a device, or an enclosure. The electrical wires of the grid can be considered as a BDC pathway, but also as imperfect antennae connected to the upstream and downstream components of the grid and are susceptible to broadband frequencies, including the lower frequency (long wavelength) coupling due to the long length of the power transmission lines. Additional factors influence the level of coupling and interference: wave polarization, geolocation, ground surface conductivity, height of the wires above ground, and others. With their long length, the electrical transmission lines are especially susceptible to the E3 HEMP, as further described below.

The internal wiring of a building, including data and communication centers, are also susceptible to EMF and would couple directly to the radiated field if the building is without a proper shielding. The exposed long wires or internal unshielded wires are susceptible to the radiated field. Without a proper mitigation, the induced currents generate magnetic fields that couple the neighboring conductive lines and surfaces. Protection from radiated coupling of EM field is achieved by shielding of equipment with a conductive enclosure. In some cases, the whole building can be a shielded structure commonly known as a Faraday cage. Because input and output cables for power and communications must be present, special methods are employed to lower and limit the propagation of the induced transients via these wired connections and their conduit openings.

As described in the referenced related prior patents, one possible way to mitigate the effects of EMP is to provide a response in real time to an event and disconnect the protected systems by isolating them physically from long cables, wires, antennas, etc. Specifically, to protect from the damaging effects of EMP, the environment must be persistently monitored with applicable sensors and when an EMP is detected, the appropriate isolation systems must be triggered to provide protection for the infrastructure. Given the high speed of the HEMP E1 event, this is not an easy task and has been addressed in the referenced relevant patents with methods and systems designed and implemented for specific environments.

A straightforward protection method is to equip the electrical and electronic systems with means that prevent the excessive magnitude of voltage and current and absorb and redirect the energy of the EMP. Generally, these devices are known as surge suppressors and arrestors. Most commercially available surge suppressing devices are designed and built to offer protection to lightning with micro-seconds response times. This is not sufficient for protection from the HEMP E1 with a few nanoseconds rise time and from IEMI. The referenced related applications provide solutions for mitigation of the E1, E2, and E3 components of an EMP. However, they were predominantly oriented to electrical power systems operating at extremely low frequencies (ea. 60 Hz of the US electrical grid). These systems are not substantially affected by the insertion of a protection systems described in the referenced related applications and other protection systems described in the literature. The protective circuits do not influence the normal operation of the system.

This is not the case for data communication systems with physical channels operating at high speed (wide bandwidth). The incorporated protective means result in insertion loss and channel capacity degradation predominantly based on the impedance mismatch and the resulting signal reflections. In general, the parasitic capacitance of the protective components introduces an equivalent lump-element change of the characteristic impedance of the channel. In a digital channel, the parasitic capacitances are charged/discharged when the logical level signals change. This results in degrading the bandwidth of the channel. For example, a channel with 1 Gbps bandwidth degrades to 100 Mbps transmission rates.

The referred non-provisional patent application Ser. No. 17/521,369 filed on Nov. 8, 2021, titled Method and Systems for Protection of Electrical Multiports from Electromagnetic Pulse Using Impedance Matching and Low Insertion Loss Design provides solutions to these problems. The present invention further expands and enhances the protection of communication channels, such as Ethernet over twisted pair with Power over Ethernet, to address all Power over Ethernet (PoE) modality as defined in the current standards. Following the methodology given in patent application Ser. No. 17/521,369, the present invention provides solutions for implementing protection of high-speed (high bandwidth) channels with different modes of PoE and without degradation of the channel capacity. The design of the protection device includes differential-mode (DM) and common-mode (CM) protection for the four twisted wire pairs.

The need for low insertion loss and impedance matching is addressed in the non-provisional patent application Ser. No. 17/521,369. The present invention includes a solution for transient search protection of the Ethernet communication channels with multiple modes of Power over Internet (PoE) without degradation of the of the broadband application designs of the monitored system. The present invention describes the methods for the proper selection of protective components, protective circuits design, and the printed circuit board (PCB) layout. The need to use multiple protective components requires addressing their parasitic capacitance, leads inductance, and the equivalent series resistance. Pertinent electrical design parameters, such as the magnitude of the impedance, insertion loss, and the parasitic elements, are considered, minimized, and compensated for all design configurations. The detailed description for each method is beyond the scope of this application. General description and some details are provided in the cited patent application Ser. No. 17/521,369. However, a major consideration of the current invention is what is known as interoperability.

The Institute of Electrical and Electronic Engineers (IEEE) glossary defines interoperability as the ability of two or more systems or components to exchange information and to use the information that has been exchanged. The IEEE has incorporated the work of the International Organization for Standardization (ISO) and the International Electrotechnical Commission (IEC) into The International Standard ISO/IEC/IEEE 8802-3. The Third edition, 2021-02, defines multiple implementations for the telecommunications and exchange between information technology systems. This invention describes method and systems based on the method for providing protection on communication channels without degradation of the channel capacity and interoperability with respect the Power over Ethernet (PoE) mode. More specifically, the object of this invention is the protection of copper-based Ethernet channels and PoE for the current IEEE Ethernet standards with multiple PoE implementations. The invention related to EMP protection of devices that support PoE, such as voice over IP (VoIP) telephones, wireless access points, Internet of Things (IoT) nodes, video cameras, and others, that can receive power safely from the same access Ethernet ports that are used to connect to the network.

The main purpose of the invention is to provide protection to the communication infrastructure with PoE without compromising the performance of the protected system. The protective system based on the present invention protects the connected systems by limiting and absorbing the energy of the transient surge pulses before they can reach the input ports of the protected infrastructure. The present invention recognizes that the teachings of the related referenced patents and patent applications can be extended to provide protection from EM energy interference for all current PoE standards.

PoE was first defined in the IEEE 802.3af standard (2003), which supplied up to 15.4 W of power to a connected powered device (FIG. 12). It was followed by an Enhanced PoE, providing up to 18.6 W of power. Subsequent versions increased the amount of power that can be supplied to a powered device, as follows:

IEEE 802.3at (PoE+, 2009)—Supplies up to 30 W of power.

IEEE 802.3bt (PoE bt)—Supplies to up 90 W of power. It specifies Type 3 (also known as PoE++), that can carry up to 60 W for each PoE port, and Type 4 (high-power PoE) that can supply maximum power output 90 W on each port (insures minimum delivery of 71 W).

As can be seen from the table in FIG. 12, in addition to type of PoE, the standards specify different classes and the cables with which they must be used, cable maximum length, number of twisted pairs in the cable, etc. Multiple references are available for the PoE standard specifications and details that are out of the scope of this application. For example, very informative, comprehensive, and easy to understand information with sufficient details for PoE is provided at https://en.wikipedia.org/wiki/Power_over_Ethernet. In this patent application, the essentials with respect to PoE modalities, also referred to as alternatives, are described in this application to provide the base for the method and implementation of electromagnetic protection.

The twisted pair of coper wires is an essential technical element with respect to Ethernet communication channels as a physical media. Related to the use of a twisted pairs of wires are the different categories of CAT cables (from "category"). In some references, the CAT cable specification is associated with the Ether-CAT (Ethernet for Control Automation Technology) standard IEC 61158, introduced in 2003. The specifications of different CAT cables are related to the maximum speed/bandwidth and the level of immunity that the cable provides against EMI. For clarity, we indicate that at any instant, common-mode coupling consists of two equal signals with the same polarity, whereas differential-mode consists of two equal signals of opposite polarity. In both cases the voltage magnitudes are with reference to earth-ground potential, and they will result in differential and common mode currents. In FIG. 11, differential-mode (DM) and common-mode (CM) currents are presented, and the noise source is generically indicated as N inside a circle. FIG. 11 also displays how the general case of mixed-mode (MM) currents, can be separated into DM and CM components. It is an objective of the current invention to provide protection against the general case of MM surges and EMI which is described by their DD and CM.

EMI and noise pickup is common-mode with a negligible differential-mode component, only provided the wires of the communication channel are twisted tightly together. If not, the result is unintentional asymmetry, which will lead to a small unintentional differential-mode noise component. The problem with that scenario is that the actual signal is (by design) transmitted in a differential fashion and if the coupled noise has a differential component, it will end up interfering with the actual (useful) signal. In that case, the signal to noise ratio may decrease to a level that the actual signal cannot be recognized by the receiver.

In addition to twist per unit length, CAT cables are different with respect to their resistance. IEEE 802.3af assumes that a 100 m CAT3 cable that has a worst-case (DC) loop resistance of 20 Ω. This is the cable resistance is suitable for low-power PoE applications of 13 W at the end of the cable. IEEE 802.3at assumes that a 100 m CAT5e cable that has a worst-case loop resistance of 12.5 Ω for Type 2 medium power applications. This is the cable resistance assumed for medium-power (Type 2) applications of 25.5 W at the end of the cable. In addition to better shielding, the newest CAT cables further improve the capacity of the communication channels with respect throughput (bandwidth) and DC current (PoE) capabilities. The cable standards range from Category 3 to Category 8 with speed of 100 Mbit/s to 40 Gbit/s and bandwidth from 12.5 MHz to 1.6 GHz. These cables typically have four pairs of wires for each connection (early Ethernet used only two of the pairs) and the commonly used RJ45 connector (registered jack with code 45, also referred to as 8P8C or eight-position eight-conductor). Unlike the earlier –T standards, the new –T1 interfaces were designed to operate over a single pair of conductors and introduce the use of two new connectors referred to as IEC 63171-1 and IEC 63171-6.

Power source equipment (PSE) for the Ethernet over twisted wire pairs may be placed in two locations with respect to the link equipment: coincident with the data transmitter (endpoint PSE) or the link midspan (midspan PSE). The current invention applies equally to PoE provided by endpoint PSE or midspan PSE. FIG. 13 displays the possible location of the PSE: at the endpoints (top) and the midspan (bottom). Please note the location of the PSE with respect to the physical layer device (PHY), the medium dependent interface (MDI), and the power interface (PI). The current invention provides solution for transient protection and applies to endpoint and midspan PSEs.

FIG. 14 and FIG. 15 refer to the specifications of IEEE Standard for Ethernet over twisted pairs and specifically for the physical layer and parameters for the Power over Ethernet (PoE) over 2-pair and 4-pair endpoint PSE locations. The powering equipment (PSE) is on the left side and the powered device (PD) is on the right. The pin numbers at the edges of the powered equipment correspond to the pin numbers of the registered jack code RJ45 connector (also referred to as 8P8C or eight-position eight-conductor), as shown in FIG. 16 on the left. The conventional allocation of transmit (TX) and receive (RX) pin is also shown. On the right side of FIG. 16 is given a conceptual presentation of a twisted pair data line with a differential mode signal levels +/−2.8 V. Per different standards, some or all the coper wire pairs are used to carry simultaneously the data and the current of the DC power.

The twisted pairs are used to reduce the effects of electromagnetic radiation and interference. Parallel cables in a bundle (not twisted) may easily inject noise into each other, as the cable acts as a current-carrying inductor and creates a magnetic field. A differential transmission technique is an excellent starting point in preventing this magnetic field effect since this method uses two cables, one for the original signal and one for an inverted copy of the signal that each induces an equal and opposite magnetic field that cancels the other out.

IEEE 802.3af (standard PoE) operates with supply voltage of 44-57 V, and supply current of 10-350 mA. In this standard, the maximum power output of a port is limited to 15.4 W. However, some power will be lost on the Ethernet cable during the transmission. Thus, the minimum guaranteed power available at the PD is 12.95 watts per port. It can support VoIP phones, sensors and many new devices based on the low-power implementations.

The updated IEEE 802.3at standard (PoE+), is backward-compatible with the standard PoE. The supply voltage of PoE+ ranges from 50 V to 57 V, and the supply current can be 10-600 mA. It provides up to 30 W of power on each port of a PSE. Due to power loss, the minimum output power assured on each port is 25 W. This type can support devices that require more power like LCD displays, biometric sensors, tablets, etc.

The latest PoE standard IEEE 802.3bt, defines two types of powering/wattage (FIG. 12), delivering more power through two or more pairs of Ethernet cables. In Type 3 and Type 4 modes, PSEs will identify the PDs and set the power accordingly to the maximum PD power, resulting in a better power-delivery system. Type 3 (PoE++) can carry up to 60 W for each PoE port (minimum power ensured on each PD port is 51 W) over a single CAT5 and above cable to power devices like video conferencing system components. Type 4 is named higher-power PoE. It can supply maximum power output of 100 W on each PoE port (minimum power ensured on each PD port is 71 W), which is suitable for devices like laptops or TVs, etc. The two types of IEEE 802.3bt are backward compatible with 802.3af and 802.3at.

The standardization of the cables and pairs alongside with the backward compatibility is very important for providing interoperability. The current application considers all standard specifications for the design and implementation of transient surge protection. The table in FIG. 17 provides a good summary of information for the PoE specifications of different modalities with the variations of data, power, and mixed DC and data pairs allocations for 802.3af standard (https://en.wikipedia.org/wiki/Power_over_Ethernet). As the table shows, the PoE for mode A has DC+ on pins 1 & 2 with the DC− on pins 3 & 6. For mode B, the DC+ power is provided on pins 4 & 5 and the DC− on pins 7 & 8. In the same assignment, pins 1 & 2, pins 3 & 6, and pins 7 & 8 are termination points of three twisted wire pairs carrying data. It is important to note that the newly adapted standards are backward compatible, including the historically defined pin allocation to cable wires (and pairs) termination per ANSI/TIA-568 (American National Standards Institute/Telecommunications Industry Association).

FIG. 18 illustrates the possible Ethernet cable connection to a printed circuit board (PCB) mounted RJ45 socket. When two identical sockets are used the PCB traces must cross to connect the pins of the sockets, as shown on the left. The images on the right in FIG. 18 show RJ45 socket labeled A and an RJ45 socket labelled B. Socket B is a vertical mirror of socket A, resulting in a pin orientation that allows socket A to connect to socket B with traces that do not cross. This has several important implications. The PCB layout is easier, and the length of the traces can be the same in addition to keeping the traces of the pairs at equal distances. This is essential for high speed (high bandwidth) communications. It provides the ability to match the characteristic impedance of the twisted pair with the transmission line formed by the traces on the PCB.

If there are any impedance mismatches along the signal path, the maximum power will not be optimally transferred at that point, and some of the signal energy will be reflected to the source. If the impedance of longer cables and/or PCB traces is not well-matched, the signal quality can be degraded to a point where it results in a communications failure. The CAT cables have four balanced twisted pairs that have 100 ohms characteristic impedance, and they are twisted at different turn-ratios to reduce crosstalk between pairs. The use of proper PCB layout of differential traces is essential, and it is used for the design implementations of the EM surge protection methods of the current invention.

FIG. 19 displays the basic parameters that are used during the PCP design and layout of differential signal traces for the implementations of the current invention. Some of the most important considerations and rules are:
 differential traces are of equal length,
 spacing is constant everywhere along the length of the traces,
 avoid using vias to minimize inductance and impedance mismatch,
 keep the differential pairs as far away as possible to eliminate cross talk between the pair (in FIG. 19 distance D>2S).

The electrical length between the two traces of a differential pair must be the same to minimizes the skew and phase difference of the differential signals. The space between the two traces S in FIG. 19, is related to the width of the traces A in FIG. 19. Respectively, the traces with sufficient cross-section for the EM transient current need to be spaced differently. The stated rule is that the traces in a differential pair must always be spaced close together. In this case however, the electromagnetic coupling between them will create large mutual inductance and mutual capacitance. This will cause the single ended impedance of a trace in the differential pair to be different from the characteristic impedance. This is something that happens whenever there is strong parasitic capacitance between conductive elements in an electronic system. Special attention has to be given to the routing of the traces forming the differential pair of pins 3 & 6.

This important consideration has been a driving principal when designing the traces for the four differential pairs of the PoE EM protection systems. The width that gives a target characteristic impedance does not provide the single-ended impedance value if the pairs are spaced too close together. The single-ended impedance specification matters for termination, while the differential impedance specification is only a shortcut to the single-ended impedance value. The trace width required for a differential pair to have a matching differential impedance single-ended impedance is a function of spacing of the traces, the substrate thickness, and its dielectric properties. Once impedance is understood and correctly calculated, it can be used to determine the propagation constant. This determines the insertion losses, S-parameters, and any potential need for length tuning along the interconnect.

FIG. 20 is an example that illustrates the implementation of electromagnetic energy interference (EMEI) protection for the Ethernet over twisted wire pairs devices with PoE. The protection of the overvoltage surges for the data lines (four data pairs) and the PoE lines for Mode A and Mode B, using the wires of one data pair for the positive (DC+) and the wires of a second data pair for the negative (DC−) power line. The schematic demonstrates one example of EMI surge protection implemented with low capacitance transient voltage suppression diodes (TVSs) and gas discharge tubes (GDTs) to provide differential-mode (DM) and common-mode (CM) protection, as previously discussed. The TVSs have a characteristic fast response time but relatively limited energy absorption capacity. The GDTs provide the high-capacity energy shunting capability.

The current invention provides a method and systems for EMEI protection of multi-port multimode PoE communication channels based on the use of hybrid technologies for limiting, absorbing, and shunting of excessive energy. This hybrid technology approach is based on appropriate combination of technology elements to form surge protection assemblies which are PCB mounted as bulk components or integrated circuits. TVSs can respond to over-voltages faster than other common over-voltage protection components such as metal oxide varistors (MOVs). The actual clamping occurs in roughly picoseconds. This makes transient-voltage-suppression diodes useful for protection against very fast and often damaging voltage transients. However, in a practical circuit implementation the inductance of the components' leads imposes a higher limit on the clamping response time. The current invention addresses the printed circuit board (PCB) layout considerations to minimize the parasitic inductance in addition to using low-capacitance components.

These fast over-voltage transients induced by HEMP E1 would be present globally on all distribution networks and can influence communication cables and devices by either internal or external, direct or indirect coupling. It is followed by relatively longer HEMP E2. The TVSs fast response time provides the initial clamping of the transient surge followed by the triggering of the GDTs which have substantially higher energy handling capacity.

FIG. 21 is an example that illustrates the implementation of hybrid EMI protection for the Ethernet over twisted wire pairs devices with PoE. In this figure, the plurality of components is presented with a block-diagram boxes. Each box represents a configuration of components to increase the energy handling capacity, to decrease the parasitic capacitance, or to enhance and facilitate the PCB layout of the circuit's implementation, which will be further described in more details.

FIG. 22 is an example that illustrates the implementation of a multi-port multimode protection system configured with six input RJ45 Ethernet sockets and respectively six Ethernet RJ45 terminal connectors for direct connection to a multiport commercial device having a set of Ethernet ports assembled in groups of six. When multiple groups of Ethernet ports are mounted on multiple rows on the panel of a network device, two multi-port multimode protection systems can be used in back-to-back arrangement. The eight pins of each PCB mounted socket RJ45 port are directly connected to the pins of the corresponding output RJ45 terminal connector via PCB traces forming differential lines.

SUMMARY OF THE INVENTION

Embodiments of the invention are defined by the claims below and not solely by this summary. A high-level overview of various aspects of the invention are given here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes, among other things, a system and method for protecting Ethernet over twisted pairs with multiple modality Power over Ethernet (PoE) from electromagnetic pulse-induced electrical system surges induced by the E1, E2, and E3 components of an electromagnetic radiation complex multi-pulse generated by the detonation of a nuclear weapon at high altitude (HEMP) or a Geo-magnetic disturbance (GMD) produce by a coronal mass ejection (CME).

In one aspect, the system and method for suppressing electromagnetic pulse-induced electrical system surges comprises a plurality of shunts placed between, and in electrical communication with, a plurality of twisted pair lines used for data transfer, PoE delivery, or both Data and PoE simultaneously. The method for EM surge protection is implemented in such manner that common mode and differential mode voltages lines that exceeds a predetermined level are limited and shunted by at least one of the plurality of shunts to prevent the voltage amplitude from exceeding a predefined desired level.

In another aspect, the response time of the plurality of shunts and the allowable voltage amplitude level of the shunts are selected and combined to achieve a predefined desired response time and protection level capacity to react to and mitigate the E1, E2, and E3 components of a complex multi-pulse EMP pulse generated by detonation of a nuclear weapon at high altitude (HEMP). In a similar aspect, the response time and the voltage limiting and energy handling capacity of the plurality of shunts responds to natural GMD or intentional electromagnetic interference (IEMI).

In a further aspect, the system and method protect line-to-line in twisted wire pair, line-to-ground, and line-to-line of neighboring twisted wire pairs, as well as combinations and sub-combinations thereof.

In alternative embodiments, the system and method of the present invention are configured to protect communication systems with multiple standards PoE modes. The differential lines PCB layout and the use of low-capacitance components provides utilization in Gigabit Ethernet over twisted pair cables. In further alternative embodiments the system and method are configured for use on multiport communication systems of networks, industrial and Internet of Things (IoT) networked devices.

In another embodiment, the system and method of the present invention are configured to protect a plurality of electronic devices associated with analog and digital communication lines typically present at data centers, command and control centers, network infrastructure, and other systems with connected input and output ports. A data center may include a multitude of electronic devices capable of receiving, switching, processing, transmitting, and storing large amounts of data which may then be accessed by authorized users using a myriad of wired and mobile electronic devices that are remote from the data center. Accessing a data center from a long distance to retrieve respective stored data is sometimes referred to as "cloud computing" or referring to the data as being stored "in the cloud." This includes endless online applications and data/information exchange, financial transactions and multimedia content, etc.

It is understood that electrical or data connections may connect data center devices with a user via the Internet, and the physical layer is based on Ethernet connections or other electrical cables for data and power. The connections, wiring configurations and associated additional equipment may be referred to as power and signal/data channels. For example, power over the Ethernet (PoE) or an "upstream signal" or a "downstream signal" depending on a referenced direction of the data/signal flow. While the optical data channels are immune to the EMP effects, they also need electrical power for the distributed amplification of the optical signals. The plurality of electronic devices associated with the physical layer and the respective electronic devices connected to the Internet must be protected from EM surges, in general, and the EMP effects, more specifically, given their extreme characteristics. Therefore, the system and method according to the present invention may be configured to protect the data communication lines that also carries DC power. In an embodiment, the shunting assemblies are positioned intermediate respective to DC power and data streams. The voltage limiting and shunting assemblies of the protection system based on the present invention does not interfere with the normal operation of the protected systems (the voltage and current of PoE and the data channels) and are configured to shunt a detected over-voltage on the plurality of electronic devices associated with the physical layer.

It is understood that the present invention provides method and systems to protect Gigabit Power over Ethernet devices with ultra-low insertion loss and without degradation of the data channels transmission rate based on characteristic impedance matching for all twisted wire pairs with differential lines implementation of the PCB traces layout.

BRIEF DESCRIPTION OF THE DRAWINGS

Illustrative embodiments of the invention are described in detail below with reference to the attached drawing figures, and wherein:

FIG. 6 is a tabulated summary of the commonly used analytical expressions for the HEMP E1, E2, and E3 waveforms with the model parameter values;

FIG. 7 is a table with the parameter values for the HEMP E1 waveform and their changes as the models and standards describing the HEMP E1 environment have evolved;

FIG. 8 is a table of additional HEMP E1 waveform characteristics;

FIG. 16 displays on the left the drawings of RJ45 Ethernet port and connector and a conceptual presentation of a twisted pair data line with a differential mode signal;

FIG. 17 provides a summary table for the PoE specifications of modalities A and B with the variations of data, power, and mixed DC/data pairs allocations for 802.3af standard;

DESCRIPTION OF THE PREFERRED EMBODIMENT

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

The characteristics of an electromagnetic pulse (EMP), in general, and high-altitude EMP (HEMP), in particular, is discussed in the context of traditional electrical environments and setups before described in detail and in context the fundamentals of the present invention regarding the protection of Gigabit multimode Power over Ethernet (PoE) systems.

Figure 1:
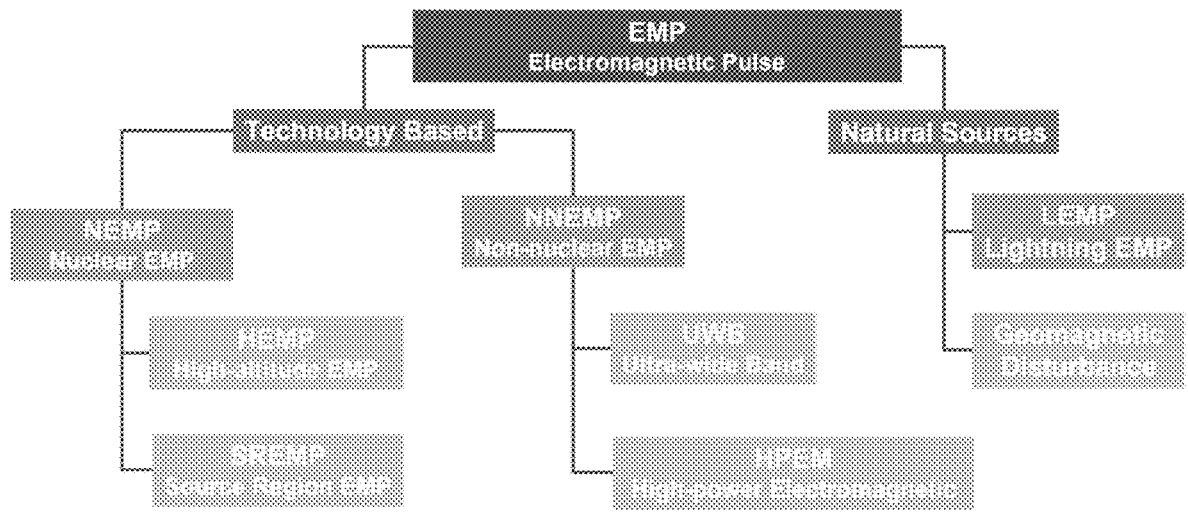
FIG. 1 is a view diagram of the sources of powerful electromagnetic surges, such as electrical grid circuit switching, natural lightning strikes, electromagnetic interference (EMI) coupling, electrostatic discharge (ESD), directed energy weapons (DEW) sources, nuclear electromagnetic pulses (NEMP), and geo-magnetic disturbance (GMD)
Figure 2:
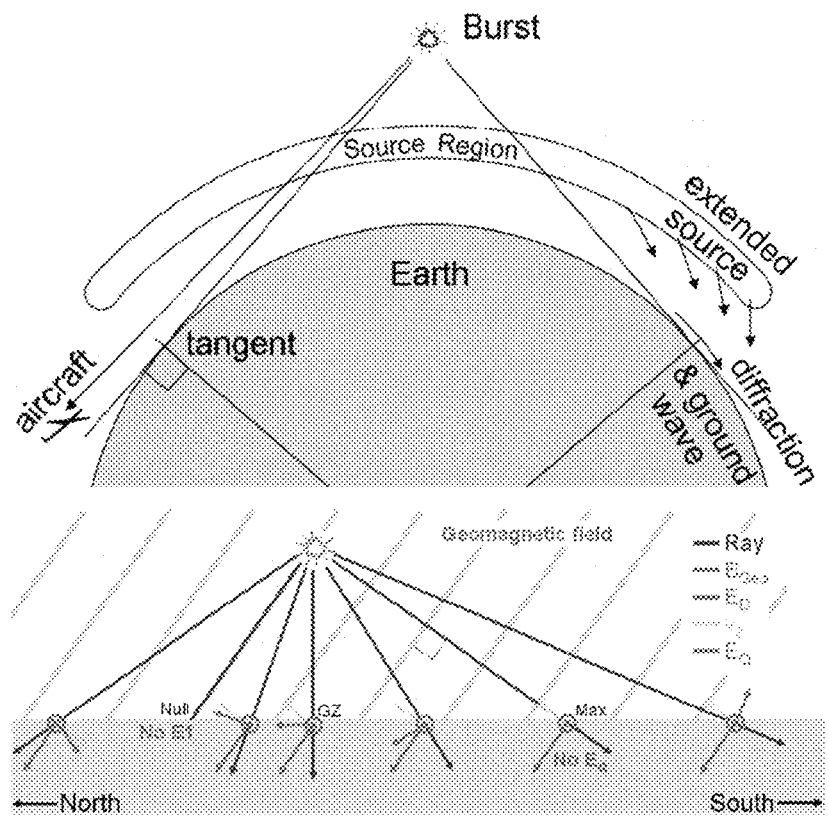
FIG. 2 is a pictograph of an electromagnetic pulse generated by a high-altitude nuclear explosion (HEMP) and the formation of the Source region in the atmosphere.
Figure 3:
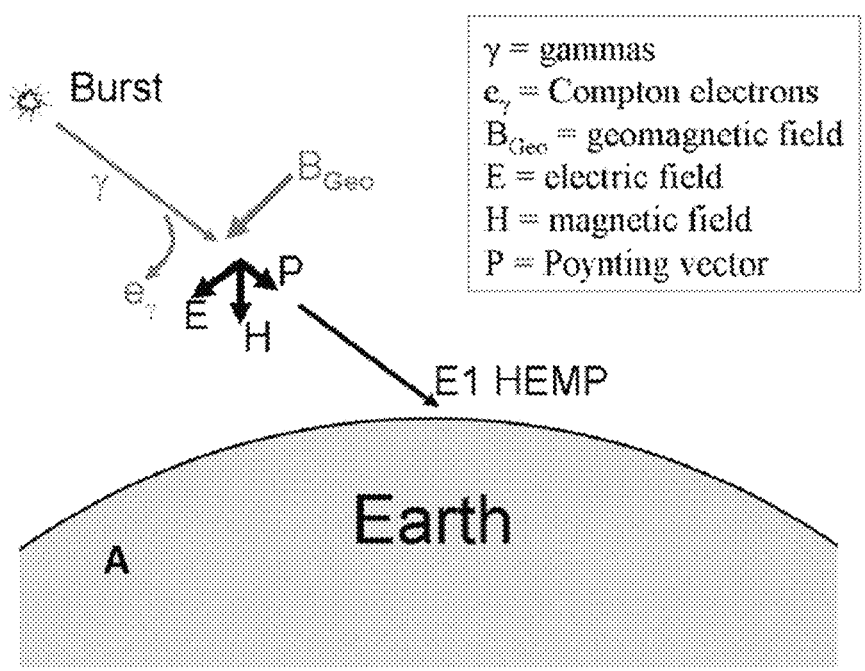
FIG. 3. is a pictograph of the nuclear burst high-altitude location and the Electromagnetic Field (EMF) Poynting vector direction with respect to the observer's location.
Figure 4:
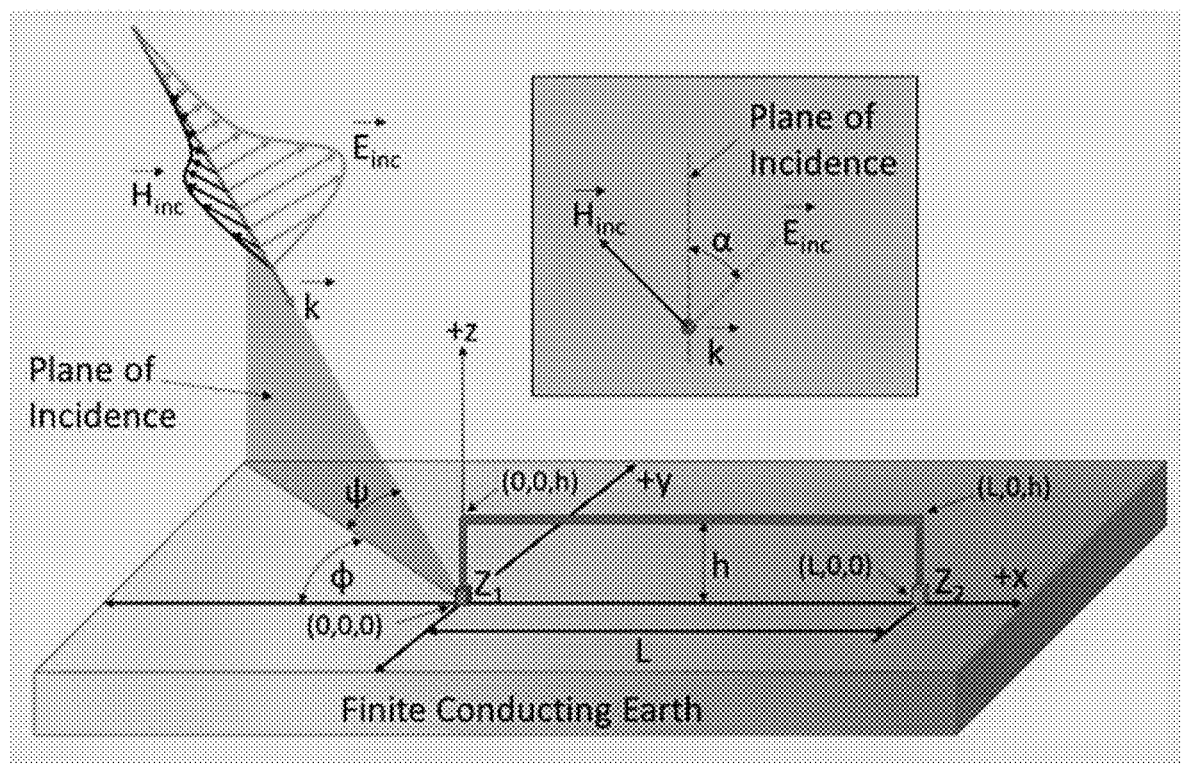
FIG. 4 illustrates the EM wave and its E (electric) and H (magnetic) vectors in the plane of incidence at a transmission wire at height h. The three associated angles ($\alpha$, $\phi$, and $\psi$) are indicative for the importance of 3D monitoring and evaluation of the Electromagnetic field (EMF)

As initially presented above and summarized in FIG. 1, an EMP is associated with naturally occurring or man generated events. An EMP generated by detonation of a nuclear weapon comprises a sequence of waveforms due to the multiple and complex interactions of the product of the nuclear blast with Earth's atmosphere and geomagnetic lines (FIG. 2 and FIG. 3). Multiple phases (pulses of varying duration) are used to describe/represent the HEMP more accurately. In this regard, the HEMP is considered a complex, electromagnetic multi-pulse, usually described in terms of three primary components defined by the International Electrotechnical Commission (IEC) as E1, E2, and E3. The three phases of the HEMP are presented in FIG. 5A. The nature of these pulses is described below.

The E1 component of the complex multi-pulse is produced when gamma radiation from the nuclear detonation knocks electrons out of the atoms in the upper atmosphere.

The electrons begin to travel in a generally downward direction at relativistic speeds (i.e., at more than 90 percent of the speed of light). In the absence of a magnetic field, the displaced electrons would produce a large pulse of electric current vertically in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very brief, but very high magnitude, electromagnetic pulse over the affected area.

The process of gamma rays knocking electrons from the atoms in the mid-stratosphere ionizes that region, causing it to become an electrically conductive ionized layer, that limits and blocks the further expansion of the electromagnetic signals and causing the field strength to saturate at about 50,000 volts per meter (50 kV/m). The strength of the E1 HEMP depends upon the altitude of the detonation of the nuclear device and the atmosphere conditions and to the intensity of the gamma rays produced by the weapon. of the more detail explanations of the undergoing physical interactions are beyond the scope of this document and may be found elsewhere.

The interaction of the very rapidly moving negatively charged electrons with the magnetic field radiates a short duration, intense pulse of electromagnetic energy. The pulse typically rises to its peak magnitude in about five nanoseconds (5 ns) and decays within hundreds of nanoseconds (200 ns–500 ns, depending on the level of intensity used for measurement). The given values may vary based on location and distant to the blast point. According to the most recent IEC standard update, the E1 pulse has a rise time of 2.5 ns±0.5 ns (from 10% to 90% amplitude levels), reaches peak value of 50 kV/m in 5 ns, and has a pulse width at half maximum of 23 ns±5 ns (FIG. 7 and FIG. 8).

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to respond and suppress the surge induced into an electrical system by an E1 pulse.

The E1 component is further characterized in the certain regulatory standards. The table in FIG. 8 gives the characteristic values of the E1 phase of the HEMP. There are several HEMP environment standards, and some are classified such as DoD-STD-2169. Others are public knowledge such as IEC STD 61000-2-9, MIL-STD-188-125-1, MIL-STD-461G, and MIL-STD-464C. The first HEMP related standard was created by Bell Labs in the 1960s. Since then, revisions have been made as can be seen from the table 1 in FIG. 7. In general, the parameter values do not present geolocation variations with respect to altitude, distance, atmosphere conditions, field vectors direction, and local Earth surface properties, which impact the formation, propagation, and reflection of the EM field.

Figure 5A:
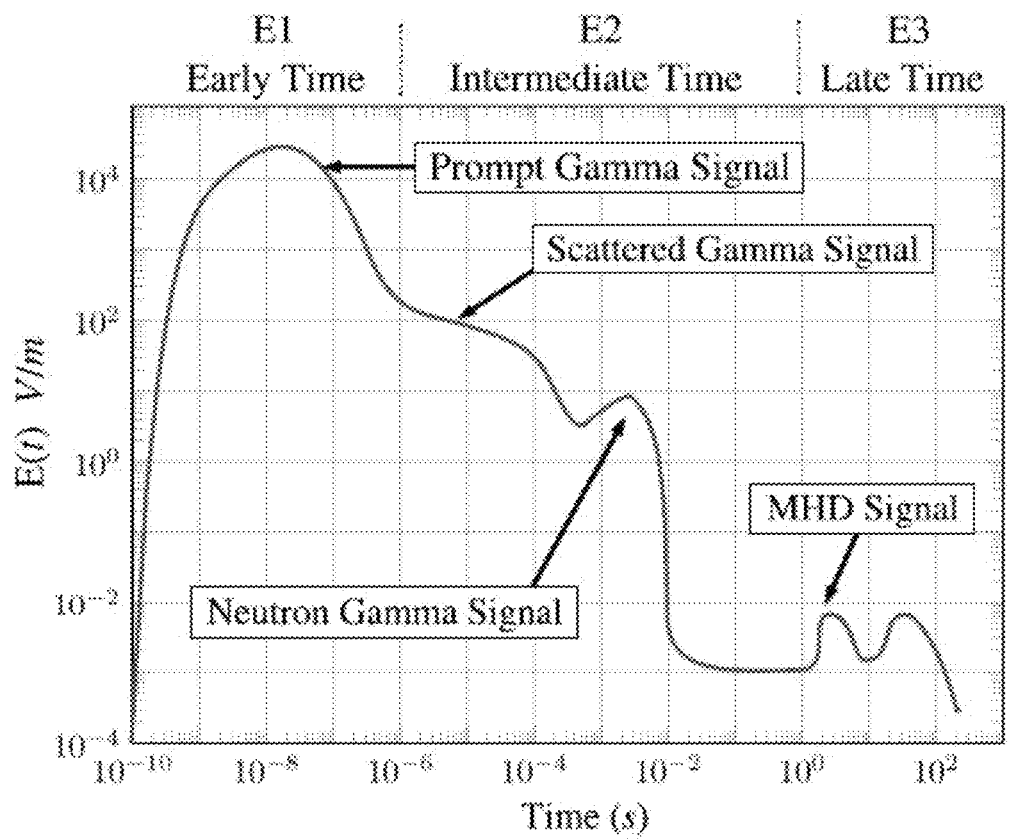
FIG. 5a is a plot representation in time domain of the complex high-altitude electromagnetic multi-pulse event with a sequence of three primary E1, E2, and E3 phases of the HEMP.
Figure 5B:
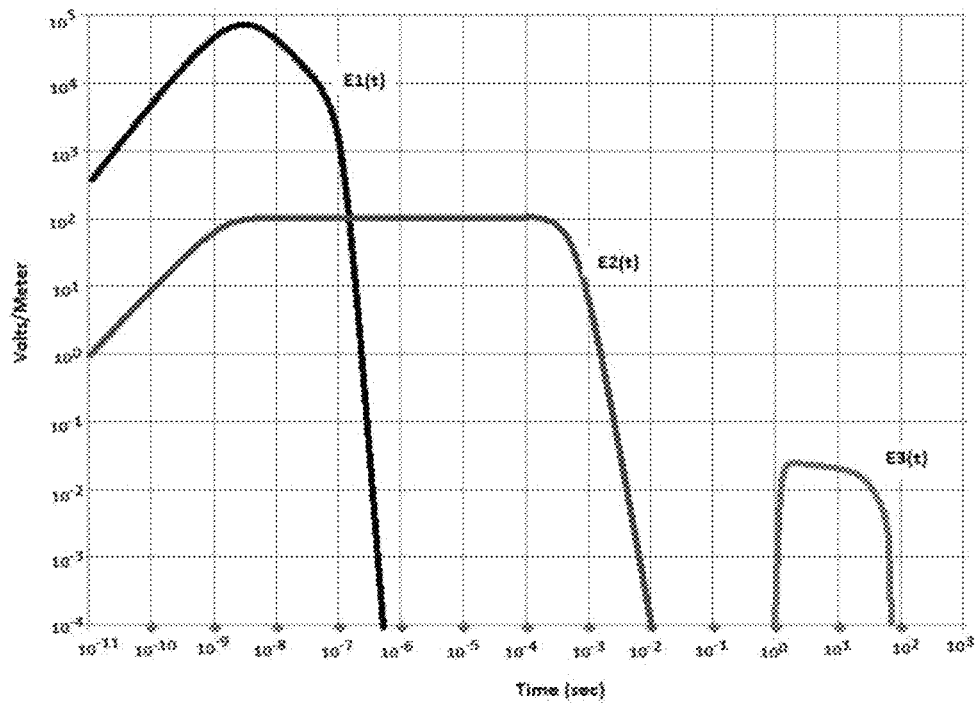
FIG. 5b is a plot representation in frequency domain of the spectral magnitude and spectral content of three primary E1, E2, and E3 phases of the HEMP.
Figure 9A:
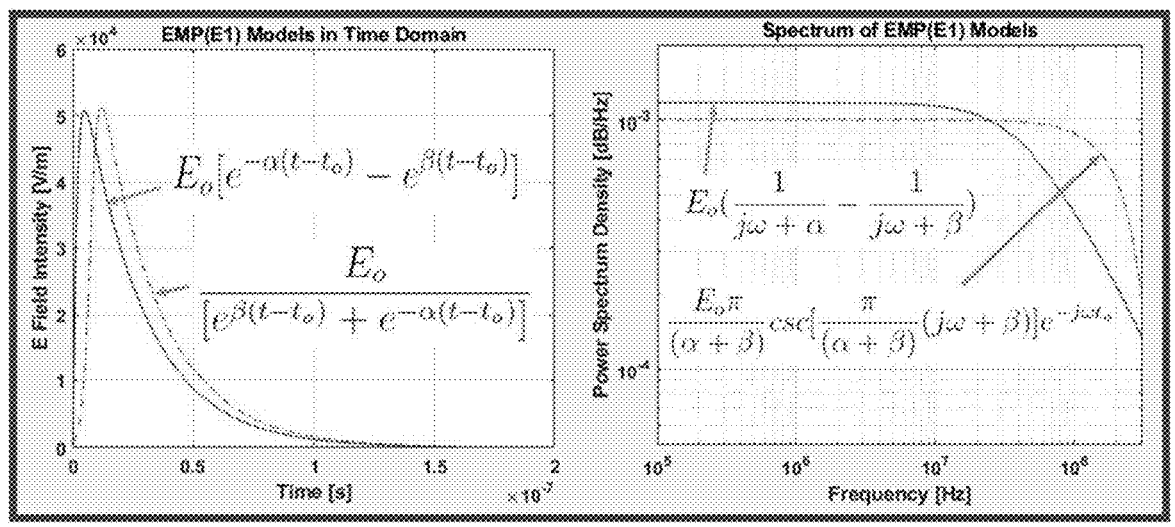
FIG. 9A presents the plots of the Difference of double exponential (DEXP) and the Quotient of exponentials (QEXP) models of HEMP E1 in time domain (left) and their respective spectral distribution in frequency domain (right)

The combined HEMP timeline based on analytical expressions is provided in IEC 61000-2-9 and is given in FIG. 5A. Two of the well accepted and used analytical expressions of HEMP are provided in IEC 61000-2-9 and given for a reference in FIG. 9A. Unclassified HEMP standards characterize the E1 phase of the EMP by idealized Difference of double exponentials (DEXP) and quotient exponential (QEXP) waveforms, as shown in FIG. 9A with the blue solid line and red dash-dot line, respectively. The EMP E1 model waveforms are given in time-domain (left) and their respective spectral content (right). The evolution of the E1 HEMP standards is presented in FIG. 7. The $\alpha 0$ and $\beta$ are the exponential constants and k is a normalizing constant for the peak amplitude at the cross section of the two exponentials. In addition to the DEXP and QEXP, two other analytical forms have been developed and presented in the literature: the P-index exponential (PEXP) and the Complimentary error function (ERFC). The main reason for these additional analytic models is some of the deficiencies of the first two models. For example, the DEXP model is discontinuous at t=0, while QEXP extends to t=$\infty$ and has an infinite number of poles in the frequency domain. In order to rigorously explore the models, the authors of this application have developed software to interactively demonstrate and compare the different models. In addition to the published models (DEXP, QEXP, PEXP, and ERFC), three new models were developed based on Log-normal, Beta, and Gamma distributions. The software was used to visualize the time domain and frequency domain characteristics of the models.

The method and devices based on the method described in this invention are based on specifications listed in the Military and Civilian Standards and are developed accordingly for accurate description of E1, E2, and E3 pulse components of a HEMP. The standards are used to design and build test facilities to study the impact of HEMP effects and to design, implement, and evaluate the level of protection of devices built for mitigation of the effects. The authors have implemented in software tools to generate the waveforms described in all publicly available standards.

The HEMP standards are derived by considering many possible waveforms in time and frequency domains. The mathematical models are created that best expresses the temporal and the spectral characteristics. The detection of E1 EMP is the most challenging, requiring ability to monitor the sensors' signals with sub-nanosecond resolution. The two models for the E1 EMP given in FIG. 9A have their advantages (simple analytical forms) and disadvantages: the double exponential model is discontinuous at t=0, while quotient exponential has the advantage of a continuous time derivatives for all orders but also the disadvantage of in that it extends to t=$\infty$ and has an infinite number of poles in the frequency domain. The model waveforms are useful for testing, but they do not present with high fidelity the complexity of the real HEMP E-field waveforms.

Figure 9B:
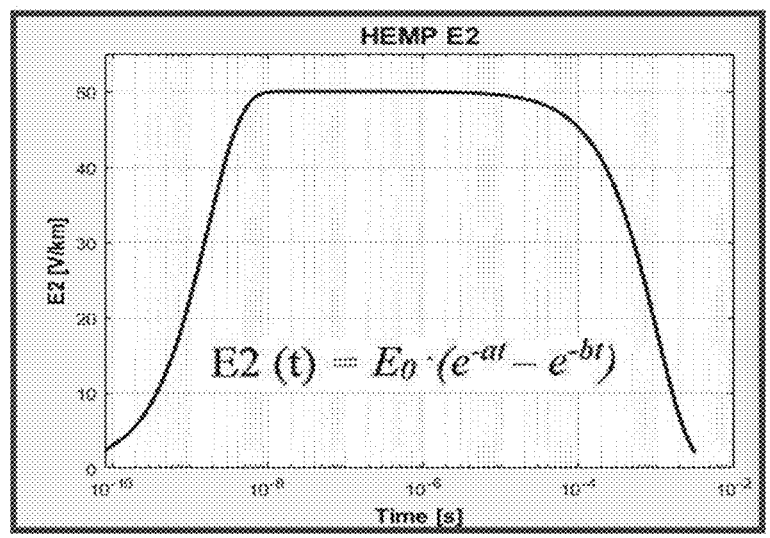
FIG. 9B displays the waveform of the E2 HEMP and its analytical expression.

The most critical aspects regarding the HEMP are its propagation speed and high energy. Protection against the hazardous effects of HEMP E1 phase must be achieved in real time with fast response (2.5 ns rise time). It is followed by the E2 and E3 components of the HEMP. In this regard, an accurate detection of E1 can be used to activate robust isolation protection from the consecutive E2 and E3 phases. The E2 component of the pulse has many similarities to an electromagnetic pulse produced by lightning, although the electromagnetic pulse intensity induced by a very close-proximity lightning strike may be considerably larger than the magnitude of the E2 component of a nuclear EMP (FIG. 9B).

Because of the similarities to lightning-caused pulses and the widespread availability of lightning protection technology, the E2 pulse is generally considered to be the easiest to protect against. However, because an EMP produced by a nuclear weapon comprises a complex multi-pulse (i.e., the E1, E2, and E3 components), the primary potential problem with the E2 component is the fact that it immediately follows an E1 component which likely has damaged any devices that were intended to protect against a lightning strike type surges and that could have potentially protected against an E2 component pulse alone. As noted in the United States EMP Commission's Executive Report of 2004, referring to the E2 component pulse, "[I]n general, it would not be an issue for critical infrastructure systems since they have existing protective measures for defense against occasional lightning strikes. The most significant risk is synergistic, because the E2 component follows a small fraction of a second after the first component's insult, which has the ability to impair or destroy many protective and control features. The energy associated with the second component thus may be allowed to pass into and damage systems."

Figure 9C:
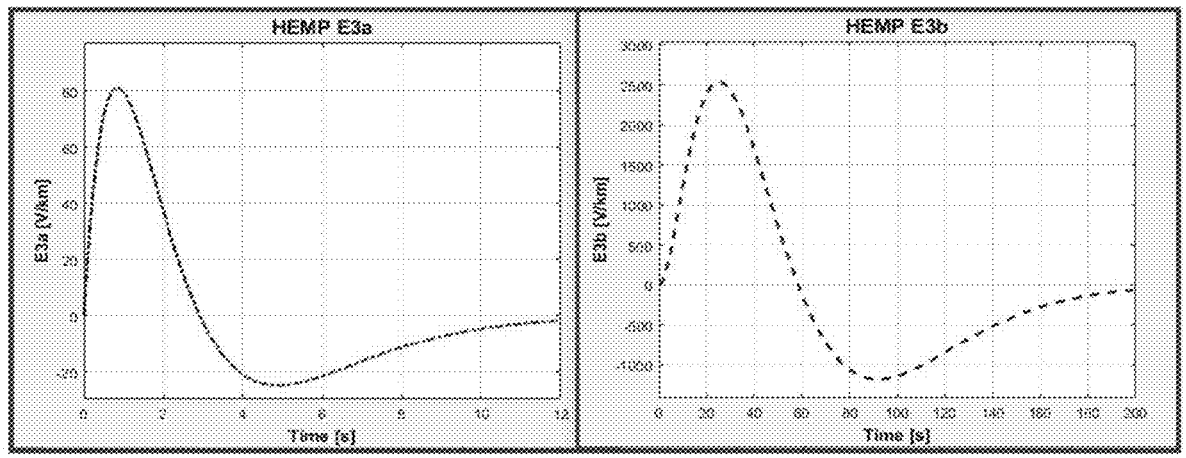
FIG. 9C displays the waveforms associated with the two phases of E3 HEMP. Additional analytical expressions and models have been developed but they are beyond the scope of this application.

The E3 component of the complex multi-pulse is a pulse with a very long rise and fall times (long period of oscillations) and lasts tens to hundreds of seconds (FIG. 9C). It is caused by the nuclear detonation heaving the Earth's magnetic field out of the way, followed by the restoration of the magnetic field to its natural place. The E3 component has similarities to a geomagnetic storm caused by a very severe solar corona mass ejection (CME), or stellar-induced EMP's from stellar gamma ray burst sources, supernova, hypernova and collisions of neutron stars. Similar to a geomagnetic storm, an E3 pulse can produce geomagnetically induced currents in long electrical conductors, which can then damage or destroy components such as power line transformers. The E3 induced currents are often called quasi-DC currents because by their time domain properties they resemble extremely low frequency waveforms (ultra-long wavelengths) inducing DC-like currents into the long power transmission lines. Nearly all major damages from HEMP E3 in modern infrastructure will occur to systems and substations of the electrical power grid, which is generally not designed to handle direct currents. The vulnerability is especially high for critical devices such as high voltage power transformers.

Figures 10, 11:
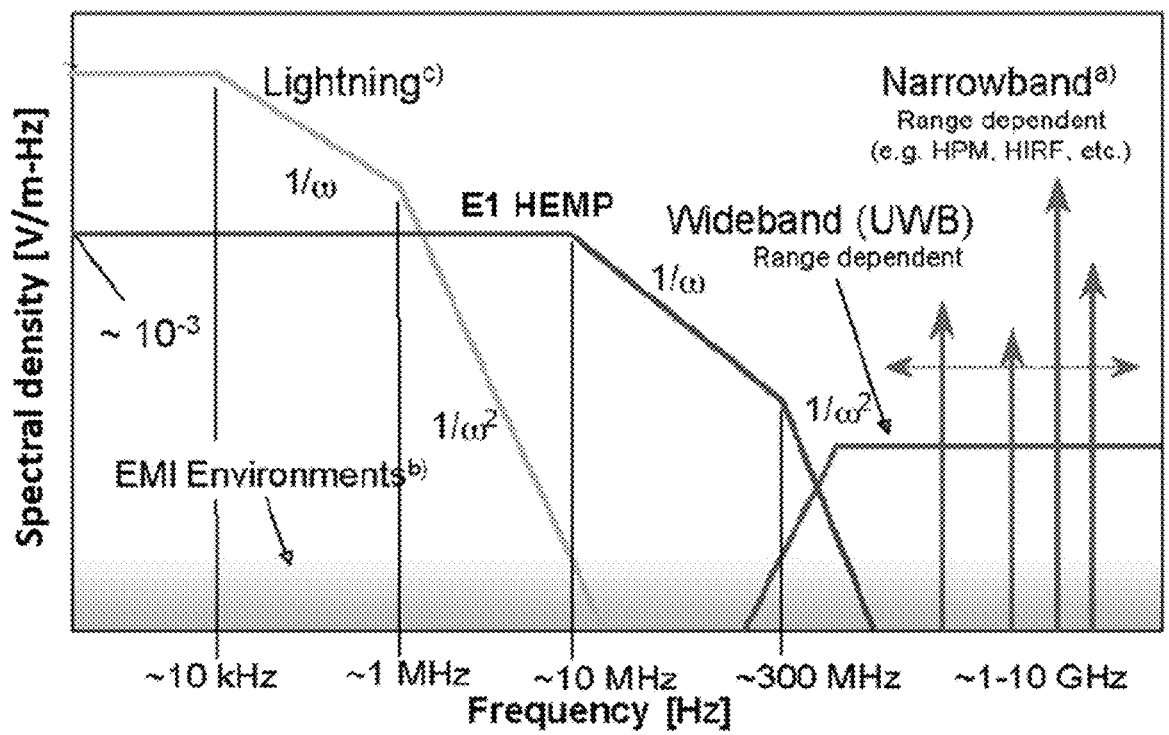
FIG. 10 illustrate the power spectrum density (V/m-Hz) associated with a HEMP E1, an atmospheric lightning, and IEMI (high-power microwave, high-intensity RF)
FIG. 11 displays a table with the main characteristics of IEEE standards for PoE.

Looking to FIG. 10, the HEMP E1 has the broader spectral content than E2. While the HEMP E2 has similarity with lightning generated EMP, in proximity, the intensity of the field from lightning exceeds the E2 field strength. The intentional electromagnetic interference may have narrow or wideband spectrum and very different intensity levels.

Looking to FIG. 11, the table presents the evolution of IEEE 802.3 Power over Ethernet standards.

Figure 12:
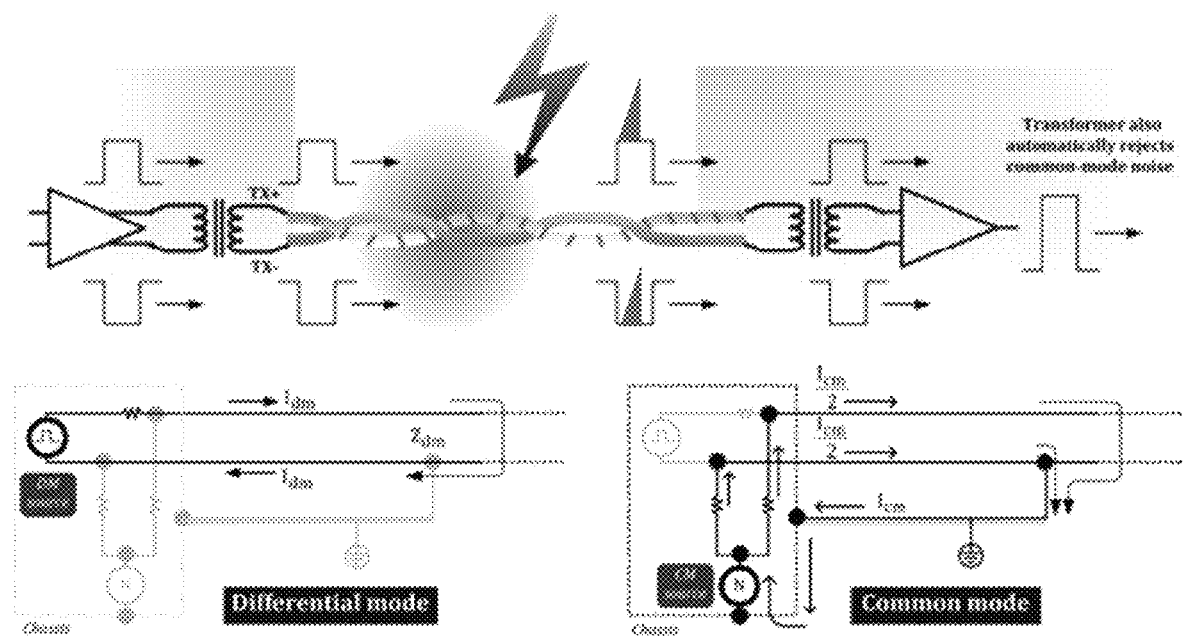
FIG. 12 illustrates the coupling of EM to a twisted wire pair and the difference between the differential-mode (DM) and common-mode (CM) currents.

Looking to FIG. 12, a twisted pair of coper wires is presented to illustrate its essential application in Ethernet communication channels as a physical media and relates to the use of a four twisted pairs of coper wires in different categories of CAT cables. FIG. 12 illustrates the common-mode EM coupling of two equal signals with the same polarity and the differential-mode coupling consisting of two equal signals of opposite polarity. In both cases the voltage magnitudes are with reference to earth-ground potential, and they will result in differential and common mode currents. FIG. 12 displays the differential-mode (DM) and common-mode (CM) currents the general case of mixed-mode (MM) currents separated into DM and CM components. It is an objective of the current invention to provide protection against the general case of MM transient surges and EMI which is described by their DD and CM.

Figure 13:
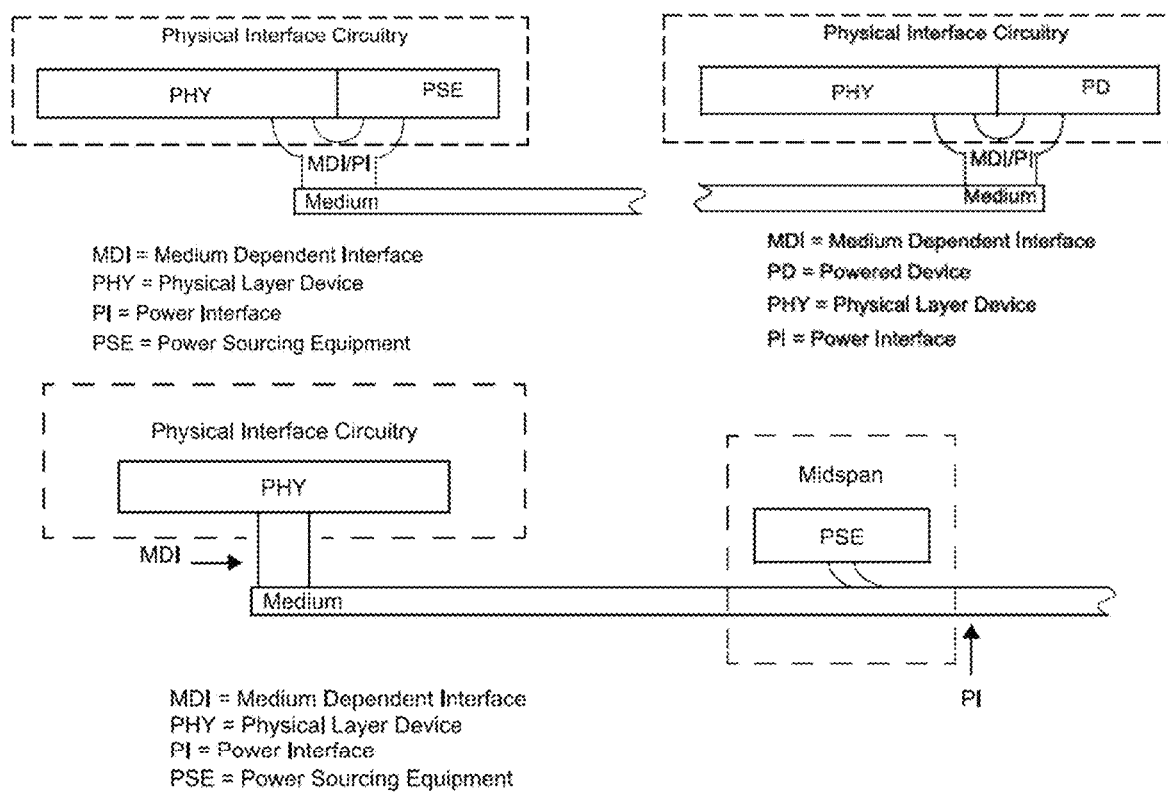
FIG. 13 displays the possible location of the power source equipment (PSE) of the endpoints (top) and the midspan (bottom) of the connecting cable (medium)

Looking to FIG. 13, the possible location of the Power Source Equipment (PSE) is shown at the endpoints (top) and the midspan (bottom) locations. Please note the location of the PSE with respect to the physical layer device (PHY), the medium dependent interface (MDI), and the power interface (PI). The current invention provides solution for transient protection and applies to both endpoint and midspan PSEs.

Figure 14:
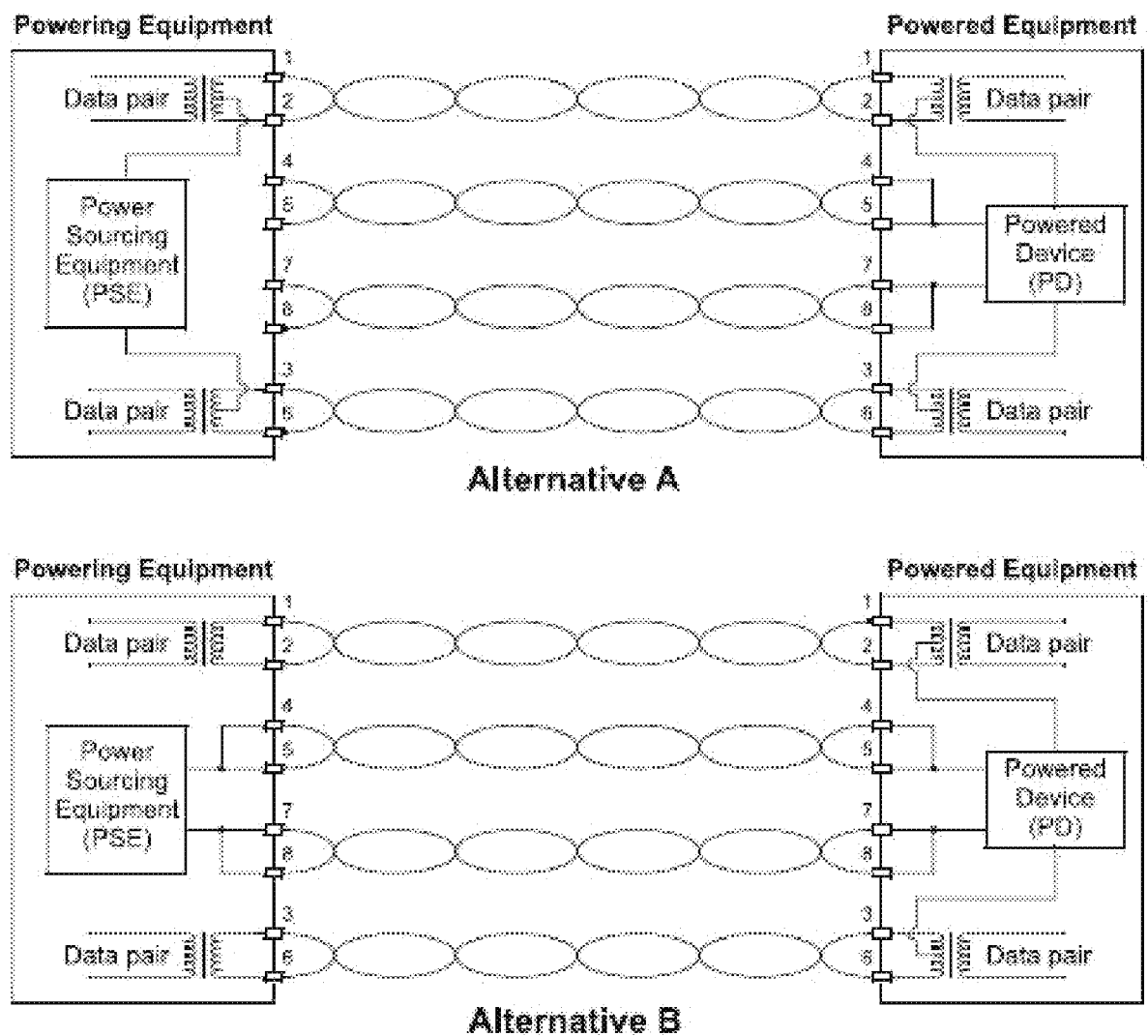
FIG. 14 presents the specifications of IEEE Standard for Ethernet over twisted pairs for the physical layer and the endpoint PSE locations alternatives for Power over Ethernet (PoE) over 2-pair.

Looking to FIG. 14, the alternative interconnections for the IEEE Standard for Ethernet over twisted pairs are given for the endpoint Power Source Equipment (PSE) and Powered Device (PD) locations with respect to the medium/physical layer with Power over Ethernet (PoE) over 2-pair twisted wire. The PSE is on the left side and the PD is on the right. The pin numbers at the edges correspond to the pin numbers of the registered jack RJ45 connector (also referred to as 8P8C or eight-position eight-conductor). While the pin pairs 1-2, 4-5, and 7-7 are in proximity and flawlessly form neighboring traces on a PCB layout, the routing of the traces for pair 3-6 to form a differential line needs special attention.

Figure 15:
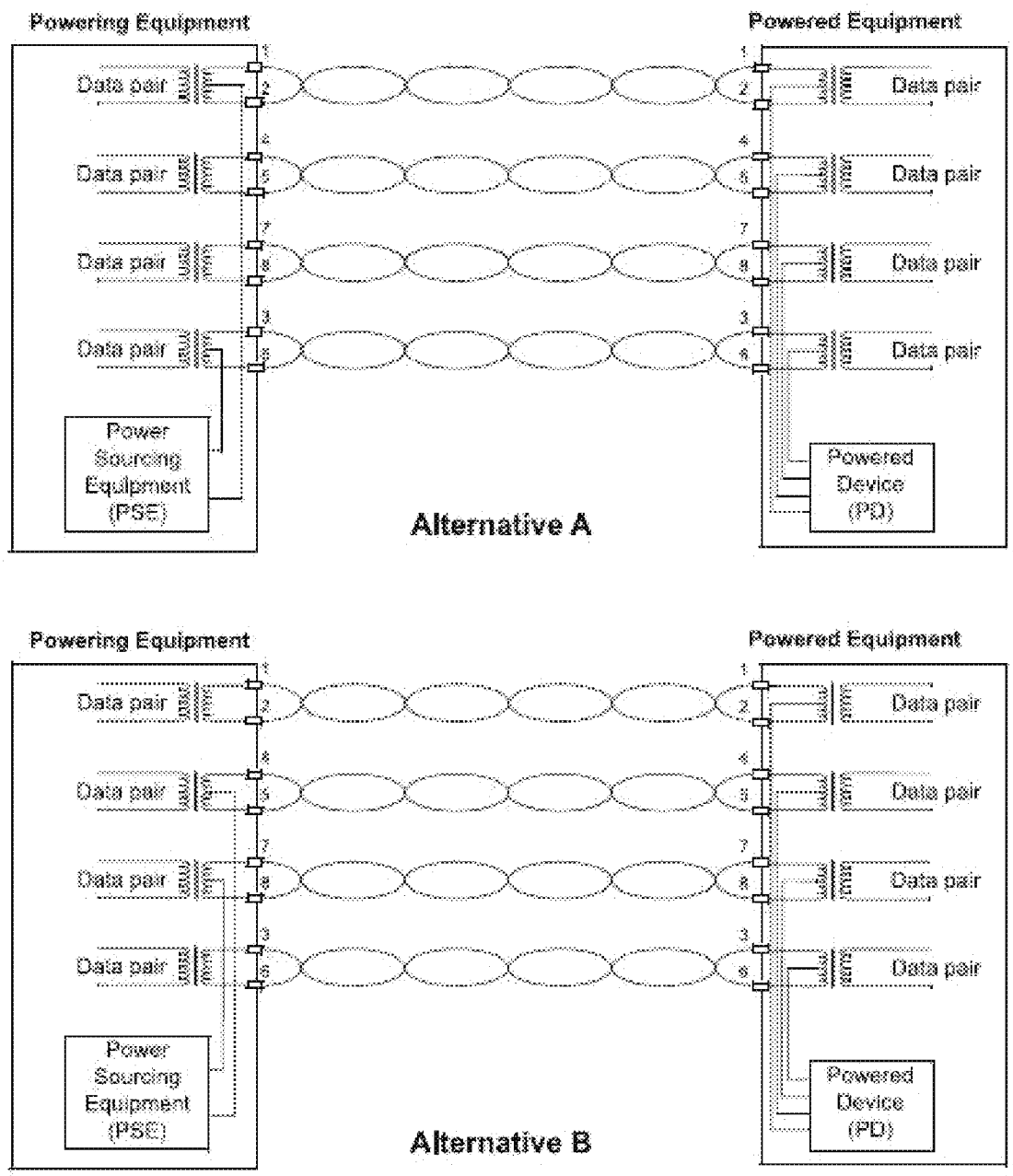
FIG. 15 presents the specifications of IEEE Standard for Ethernet over twisted pairs for the physical layer and the endpoint PSE locations alternatives for Power over Ethernet (PoE) over 4-pair.

Looking to FIG. 15, the alternative interconnections for the IEEE Standard for Ethernet over twisted pairs are given for the endpoint Power Source Equipment (PSE) and Powered Device (PD) locations with respect to the medium/physical layer with Power over Ethernet (PoE) over 4-pair twisted wire.

Looking to FIG. 16, a conceptual presentation of a twisted pair data line is presented with a differential mode signal levels +/−2.8 V. Per different standards, some or all the coper wire pairs are used to carry simultaneously the data and the current of the DC power over Ethernet. On the left of FIG. 16, the drawing of a PCB mounted socket RG45 is presented and the matching RJ45 terminal connector for the Ethernet CAT cable.

Looking to FIG. 17, the table provides a summary of information for the PoE specifications of modalities A and B with the variations of data, power, and mixed DC and data pairs allocations for 802.3af standard. This information is used to illustrate the considerations that need to be addressed in the design of EMP protection. The selection and placement of transient suppression devices have to address the difference in the voltage levels of the differential data line (+/−2.8V) and the PoE DC voltage (see FIG. 11).

Figure 18:
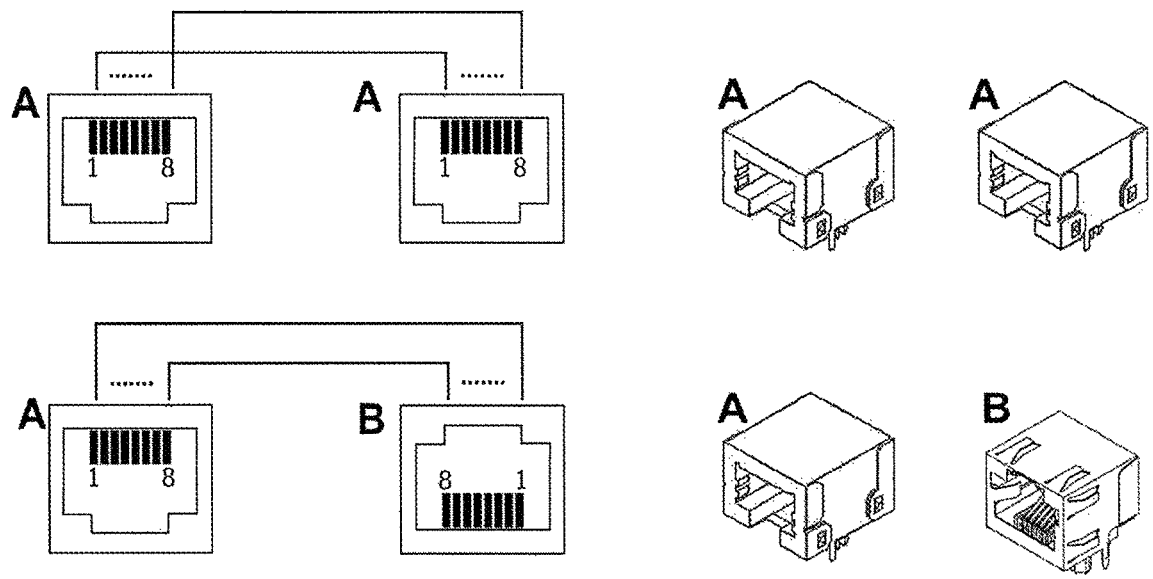
FIG. 18 illustrates the possible Ethernet cable connection to a printed circuit board mounted RJ45 socket.

Looking to FIG. 18, the drawings of two Ethernet RJ45 socket are presented on the left, labeled A and B. Socket B is a vertical mirror of socket A, resulting in a pin orientation that allows socket A to connect to socket B with PCB layout traces that do not cross. This is illustrated with the connecting lines from the pins of the identical sockets A and the connecting lines from socket A to socket B. This has several important implications. The PCB layout is easier, and the length of the traces can be the same in addition to keeping the traces of the pairs at equal distances. This is essential for high speed (high bandwidth) communications. It provides the ability to match the characteristic impedance of the twisted pair with the transmission line formed by the traces on the PCB. On the right side of the figure, the CAD drawing of the two types RJ45 are presented.

Figure 19:
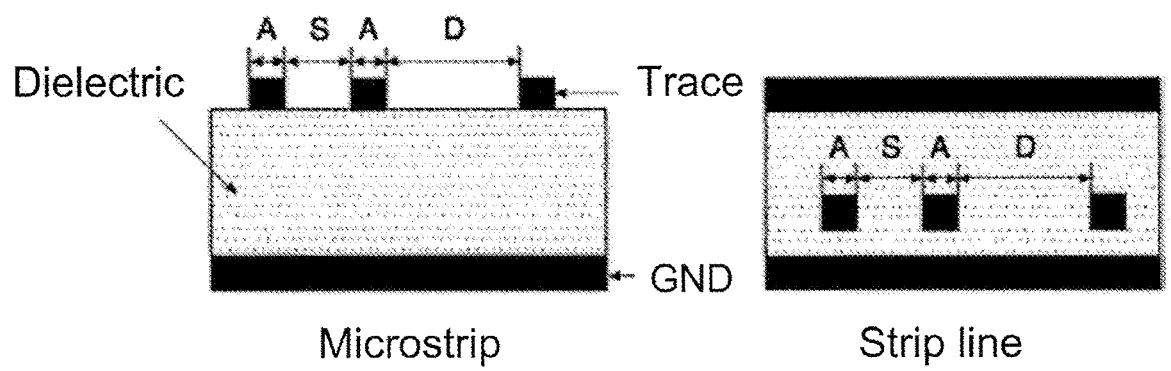
FIG. 19 displays the Microstrip and Strip line design considerations for PCB traces routing for differential signal.

Looking to FIG. 19, the PCB traces routing for differential signal is presented with some of the design parameters: trace width A; space distance between differential pair traces S; and distance to neighboring differential pair. Please see above for more design considerations details.

Figure 20:
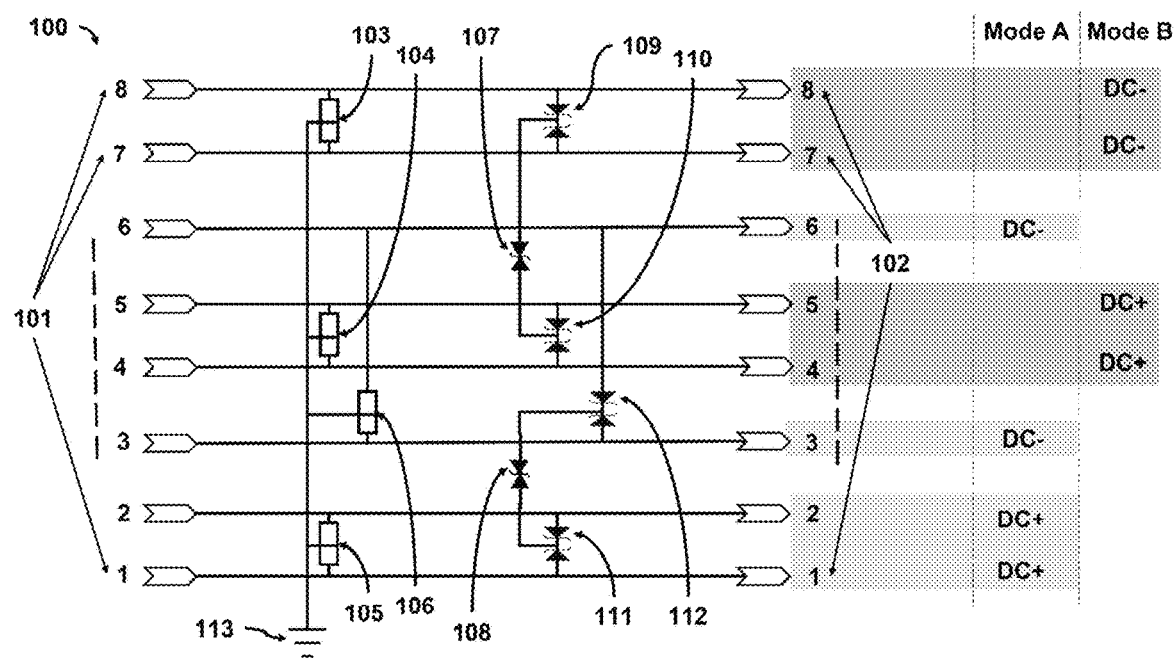
FIG. 20 is an example that illustrates the implementation of electromagnetic energy interference (EMEI) protection for the Ethernet over twisted wire pairs devices with PoE.

Looking to FIG. 20, the schematic diagram 100 of an example design implementation is given. The pins 1 to 8 of the input RJ45 port 101 are connected to the pins of the output RJ45 port 102. The PCB traces connecting pins 1-2, 3-6, 4-5, and 7-8, form four differential pairs 1, 2, 3 and 4, respectively, which are designed to match the characteristic impedance of the twisted wire pairs of the Ethernet CAT cable. The labels 103, 104, 105, and 106 indicate gas discharge tubes (GDT) with a center lead. They are placed between each trace and the ground plate of the PCB. They are selected with a threshold triggering level above the PoE voltage limit. One advantage of the three leads (center tab) GDTs is that two structures trigger simultaneously. This is important given the DC equipotential normal operation of the two traces forming the DC+ line (data pair) and the two traces forming the DC− lines (data pair).

The bidirectional transient voltage suppression (TVSs) pairs 109, 110, 11, and 112, are formed with two TVSs connected in series and opposite direction. The formed bidirectional TVS protects the differential lines. The limiting threshold voltage is selected to be ~20%-30% above the normal operational voltage range. For the +/−2.8V differential signal, 6.8V combined limiting threshold is appropriate (low-voltage TVS). The two end leads of the combined TVS pairs 109, 110, 111, and 112, are connected between the traces of each differential pair 1, 2, 3, and 4. The adjacent center points of the low-voltage TVSs are connected to the end leads of a high-voltage bidirectional TVS 107 and 108, as shown in FIG. 20.

With this implementation, the combination of low-voltage TVS 112, high-voltage 108, and low-voltage 111, provides protection to the PoE lines DC+ and DC− Mode A. The combination of low-voltage TVS 109, high-voltage 107, and low-voltage 110, provides protection to the PoE lines DC+ and DC− Mode B. With the use of low-capacitance components, this implementation provides differential and common mode protection. The routing of the differential lines traces assures the characteristic impedance matching, low reflections (low insertion loss0, and no degradation of the communication channel.

Figure 21:
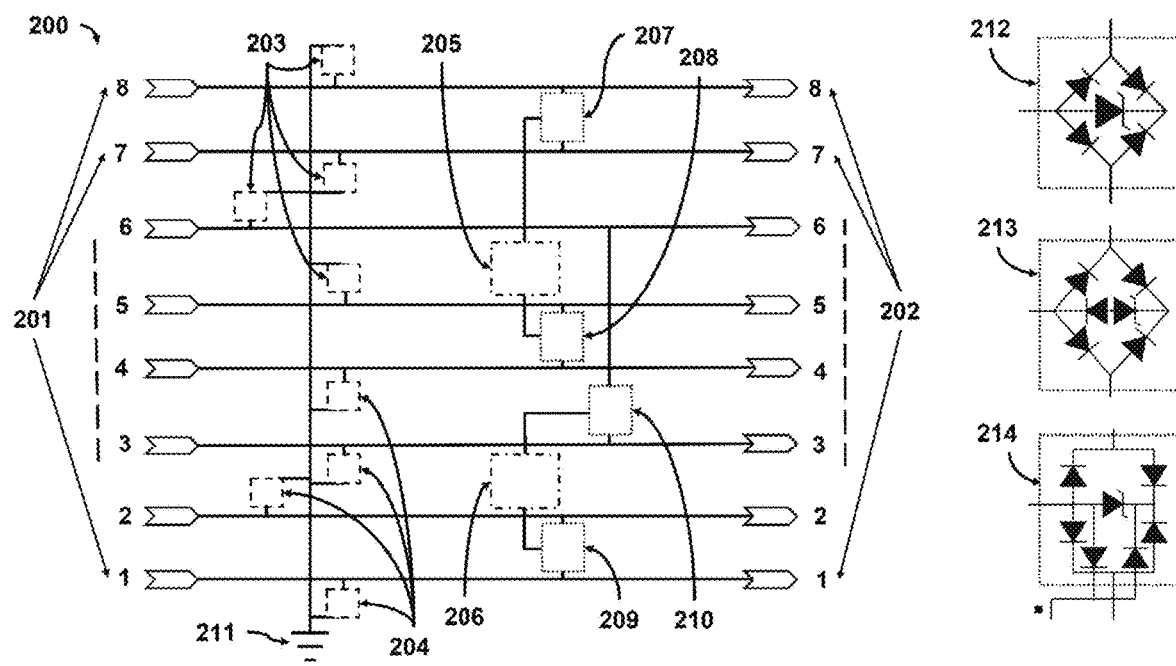
FIG. 21 is an example that illustrates the implementation of hybrid EMEI protection for the Ethernet over twisted wire pairs devices with PoE.

Looking to FIG. 21, the schematic diagram 200 of different design implementations is presented. The pins 1 to 8 of the input RJ45 port 201 are connected to the pins of the output RJ45 port 202. The integrated protection components and the hybrid group of components are presented with rectangular boxes with different contour lines. The boxes 203 and 204 refer to two-lead GDTs connected between a trace and the ground plate. The two-lead GDT provides some flexibility for the PCB layout design of the differential lines. This is illustrated in FIG. 21 with the GDTs drawn on the outside of the traces of the differential line pairs. The boxes 205 and 206 indicate individual high-voltage bidirectional TVSs in some implementations. Several low-capacitance bidirectional TVS pairs may be configured in parallel for increased current carrying capacity. The parasitic capacity imposes constraints and must be considered with respect to the crosstalk between the differential lines.

The differential mode protection of the mixed signal lines (data and DC) is presented with the boxes 207, 208, 209, and 210. Several possible implementations are presented with 212, 213, and 214. These combinations of components result in lower parasitic capacitance due to in series connections of components. When implemented as integrated circuits, the short leads result in lower (and more consistent) parasitic impedance to be accounted for in the design of the differential line. While the group configurations in 212 and 213 are very similar, 214 has two high-level limiting voltage TVSs that may be connected to ground via lead indicated with the dot.

Figure 22:
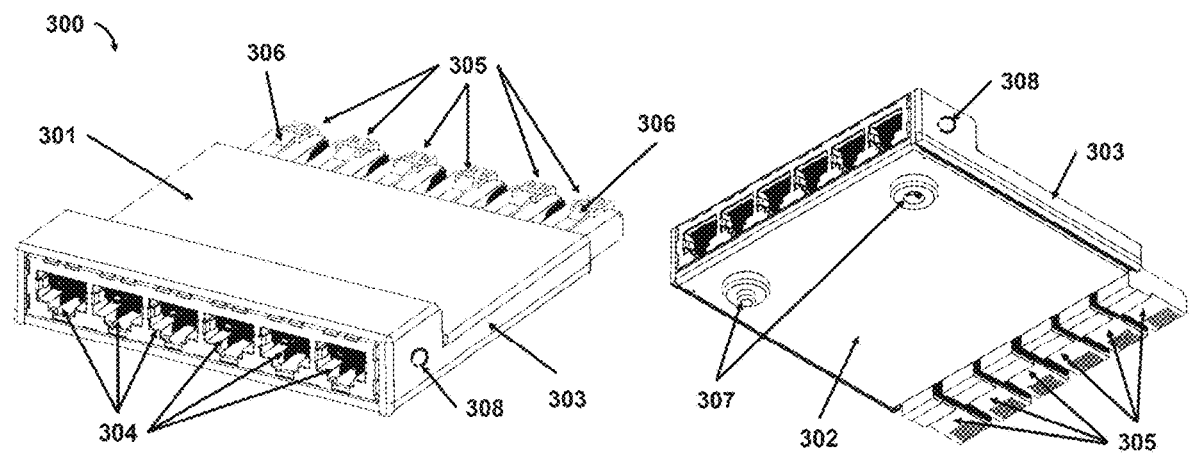
FIG. 22 is an example for implementation of multi-port multimode EMEI protection for network devices with Ethernet RJ45 ports configured in group of six.

Looking to FIG. 22, an example implementation of the multi-port multimode protection system 300 is presented with six input RJ45 Ethernet sockets 304 and respectively six Ethernet RJ45 terminal connectors 305 directly connectable to a multiport commercial device having a set of Ethernet ports assembled in groups of six ports and these multiple groups mounted on a single or multiple rows on the panel of a network to the device. The eight pins of each PCB mounted socket RJ45 port 304 are directly connected to the pins of the corresponding output RJ45 terminal connector 305 via PCB traces forming differential lines. A top panel 301, a bottom panel 302, and two side panels 303 form the enclosure of the multi-port multimode protection system 300. The terminal connectors 305 have locking mechanism 306. The enclosure provides connection from the shielding of connecting CAT cables to the network device. An additional screw terminal 308 is used for wiring a ground connection to the chassis of the network device. The spacers 307 are provided to align two enclosures of multi-port multimode protection system 300 when they are arranged together back-to-back to connect to the front panel of network devices with double rows of RJ45 sockets.

It is understood that while certain forms of this invention have been illustrated and described, it is not limited thereto except insofar as such limitations are included in the following claims and allowable functional equivalents thereof.

What is claimed is:

1. A method for suppressing an electrical surge induced by an electromagnetic pulse ("EMP") generated by a nuclear weapon detonation from reaching a to plurality of electronic devices associated with mixed signal communication channels carrying simultaneously data and direct current power ("DC power"), said method comprising:

responding to a first overvoltage exceeding a first E1 predetermined threshold level induced by an E1 component pulse in said mixed signal communication channel carrying simultaneously DC power connected to a plurality of electronic device ports associated with a network, said responding to the first overvoltage comprises limiting, absorbing, and shunting said first overvoltage within less than one nanosecond after said first overvoltage exceeds ret the first E1 predetermined threshold level so as to limit a level of said first overvoltage to a second E1 predetermined threshold level using a first shunting assembly including transient voltage suppressors (TVSs), metal oxide varistors (MOVs), gas discharge tubes (GDTs), other mechanical, electrical and ionization discharge devices (IDDs) and combinations thereof;

responding to a second overvoltage exceeding a first E2 predetermined threshold level induced by an E2 component pulse in said mixed signal communication channel carrying simultaneously DC power connected to said plurality of electronic device ports associated with said network, said responding to a second overvoltage including limiting, absorbing, and shunting said second overvoltage so as to limit a level of said second overvoltage to a second E2 predetermined threshold level using a second shunting assembly including TVSs, 23 MOVs, GDTs, other mechanical, electrical and IDDs and combinations thereof; and responding to a third overvoltage exceeding a first E3 predetermined threshold level induced by an E3 component pulse in said mixed signal communication channel carrying simultaneously DC power connected to said plurality of electronic device ports associated with said network, said responding to a third overvoltage including limiting, absorbing, and shunting said third overvoltage so as to limit a level of said third overvoltage to a second E3 predetermined threshold level using a third shunting assembly including TVSs, MOVs, GDTs, other mechanical, electrical and IDDs and combinations thereof.

2. The method for suppressing an electrical surge as in claim 1, further comprising electrically connecting said first, second, and third shunting assemblies so as to provide a surge protection, respectively, intermediate the mixed signal communication channels and the plurality of electronic devices associated with the network such that the DC power carried over the mixed signal communication channels provides power to the plurality of electronic devices associated with the network using a standard Power over Ethernet modality.

3. The method for suppressing an electrical surge as in claim 1, wherein said first, second, and third shunting assemblies, respectively, do not cause an interference with a normal operation of said mixed signal communication channels carrying simultaneously the data and the direct current of power to said plurality of electronic devices associated with the network supporting high speed Gigabit Ethernet.

4. The method for suppressing an electrical surge as in claim 1, wherein said first, second, and third shunting assemblies, respectively, do not cause mutual operational degradation when limiting, absorbing, and shunting, respectively.

5. The method for suppressing an electrical surge as in claim 1, further comprising mounting respective shunting assemblies in a casing that is in interoperable hardware connection to multiple of said plurality of electronic device ports associated with the network.

6. The method for suppressing an electrical surge as in claim 1, wherein said first, second, and third shunting assemblies include a hardware connection to said plurality of electronic device ports so as to protect against high voltage transients induced by intentional electromagnetic interference generated by directed energy weapons.

7. The method for suppressing an electrical surge as in claim 1, wherein each of said first, second, and third shunting assemblies includes a plurality of limiting, absorbing, and shunting type devices selected from groups including TVSs, MOVs, GDTs, IDDs, and mechanical solid state electronic and electrical components and combinations thereof.

8. The method for suppressing an electrical surge as in claim 7, wherein said first, second, and third shunting assemblies have varied response times and voltage threshold levels, respectively, and are operable to react to one of said E1, E2, and E3 component pulses, respectively.

9. The method for suppressing an electrical surge as in claim 1, wherein said first, second, and third shunting assemblies are mounted in a casing operable for simultaneous direct hardware connection to the plurality of electronic devices associated with Power over Ethernet power source equipment at an endpoint and midspan of said mixed signal communication channels.

10. The method for suppressing an electrical surge as in claim 1, wherein said first, second, and third shunting assemblies are electrically embedded in a multi-port protection system having a plurality of integrated inputs and outputs to directly connect to said plurality of electronic device ports associated with the network.

11. The surge suppression system as in claim 10, wherein said multi-port protection system is capable of direct connection to a multiport device having a set of Ethernet ports with Power over Ethernet assembled in groups and multiple of said groups mounted on a device panel.

12. A surge suppression system for mitigating electromagnetic energy surges induced by a natural space weather and Geomagnetic disturbance electromagnetic pulse from reaching to a plurality of electronic device ports associated with a plurality of electronic devices associated with a plurality of network mixed signal communication channels carrying simultaneously data streams and direct current power (DC power), wherein each electronic device has a signal input port, said surge suppression system comprising:
  a first limiting, absorbing, and shunting assembly that includes TVSs, MOVs, GDTs, other mechanical, electrical and IDDs and combinations thereof that is operable to respond to a first overvoltage exceeding a first E1 predetermined threshold level induced by an E1 component pulse in a mixed signal channel carrying data and direct current power upstream of the plurality of electronic device ports associated with the plurality of network mixed signal communication channels by an E1 component pulse;
  wherein said first limiting, absorbing, and shunting assembly is operable to mitigate said first overvoltage to decrease the first E1 predetermined threshold level of said first overvoltage to a second E1 predetermined threshold level within less than one nanosecond after said first overvoltage exceeds said first E1 predetermined threshold level;
  wherein said first limiting, absorbing, and shunting assembly is mounted in a casing and operable for simultaneous direct hardware connection to multiple electronic device ports associated with the plurality of network mixed signal communication channels carrying simultaneously data and direct current power.

13. The surge suppression system as in claim 12, further comprising:
  a second limiting, absorbing, and shunting assembly including TVSs, MOVs, GDTs, other mechanical, electrical and IDDs and combinations thereof that is operable to respond to a second overvoltage exceeding a first E2 predetermined threshold level induced by an E2 component pulse in a mixed signal channel carrying a respective data stream and direct current power upstream of the plurality of electronic devices associated with the plurality of network mixed signal communication channels carrying simultaneously data and direct current power;
  wherein said second limiting, absorbing, and shunting device is operable to mitigate said second overvoltage to decrease the level of said second overvoltage to a second E2 predetermined threshold level;
  a third limiting, absorbing, and shunting assembly including TVSs, MOVs, GDTs, other mechanical, electrical and IDDs and combinations thereof that is operable to respond to a third overvoltage exceeding a first E3 predetermined threshold level induced by an E3 component pulse in a mixed signal channel carrying a respective data stream and direct current power upstream of the plurality of electronic devices associated with the plurality of network mixed signal communication channels;
  wherein said third limiting, absorbing, and shunting device is operable to mitigate said third overvoltage to decrease the level of said third overvoltage to a second E3 predetermined threshold level.

14. The surge suppression system as in claim 13, wherein:
  said second limiting, absorbing, and shunting assembly is operable to mitigate said second over-voltage within less than one microsecond after said second overvoltage exceeds said first E2 predetermined threshold level of said second overvoltage;
said third limiting, absorbing, and shunting assembly is operable to mitigate said third over-voltage within less than one second after said second over-voltage exceeds said first E3 predetermined threshold level of said third overvoltage.

15. The surge suppression system as in claim 14, wherein said second limiting, absorbing, and shunting assembly and said third limiting, absorbing, and shunting assembly are mounted in said casing and operable for direct hardware connection to multiple of said plurality of electronic devices associated with the plurality of network mixed signal communication channels carrying respective data streams and direct current power.

16. The surge suppression system as in claim 12, wherein said first limiting, absorbing, and shunting assembly, said second limiting, absorbing, and shunting assembly, and said third limiting, absorbing, and shunting assembly, are respectively positioned intermediate said data stream and said plurality of said electronic devices associated with the plurality of network mixed signal communication channels carrying respective data streams and direct current power.

17. The surge suppression system as in claim 13, wherein said first limiting, absorbing, and shunting assembly, said second limiting, absorbing, and shunting assembly, and said third limiting, absorbing, and shunting assembly are respectively simultaneously connected in line with said data streams and said plurality of said electronic devices associated with the plurality of network communication channels carrying respective data streams and direct current power.

18. The surge suppression system as in claim 13, wherein said first limiting, absorbing, and shunting assembly, said second limiting, absorbing, and shunting assembly, and said third limiting, absorbing, and shunting assembly are operable to react to a timing of the E1, E2, and E3 component pulses, respectively.

19. The surge suppression system as in claim 17, wherein said first, said second, and said third shunting assemblies are operable to limit, absorb, and shunt said first, second, and third over-voltages, respectively, with minimal interference and degradation to any other shunting assembly.

20. The surge suppression system as in claim 13, wherein each of said first, second, and third limiting, absorbing, and shunting assemblies includes a plurality of devices taken from a group including TVSs, MOVs, GDTs, other mechanical, electrical and IDDs and combinations thereof implemented as bulk components or as integrated circuits so as to minimize parasitic capacitance and inductance.

21. The surge suppression system as in claim 13, wherein said first, second, and third limiting, absorbing, and shunting assemblies have varied reaction times and voltages, respectively, and are operable to react to said E1, E2, and E3 component pulses, respectively.

22. The surge suppression system as in claim 13, wherein said first, second, and third limiting, absorbing, and shunting assemblies are mounted electrically and connected to a printed circuit board of a multi-port protection system so as to form differential lines with matched impedance to twisted wire pairs of standard Ethernet cables so as to minimize insertion loss after connecting the multi-port protection system and to preserve a transmission rate of the mixed signal communication channels carrying respective data streams and direct current power.

23. The surge suppression system as in claim 13, wherein said first, second, and third limiting, absorbing, and shunting assemblies are electrically connected to a multi-port protection system having a plurality of integrated ports directly connected to said plurality of electronic device ports associated with the plurality of mixed signal communication channels carrying respective data streams and direct current power.

24. The surge suppression system as in claim 23, wherein said multi-port protection system is directly connectable to a multiport device having a set of Ethernet ports assembled in groups and multiple of said groups mounted on multiple rows on a panel of a device supporting Power over Ethernet.

25. The surge suppression system as in claim 23, wherein said multi-port protection system is directly connectable to multiport commercial devices, including powering, powered, and midspan Power over Ethernet supply equipment, so as to eliminate a need for having output Ethernet port sockets on the multi-port protection system and to eliminate the need for additional connecting cables to said plurality of electronic device ports, respectively.

26. The surge suppression system as in claim 23, wherein said multi-port protection system is directly connectable to a multiport commercial device with Power over Ethernet eliminating the need for having additional Ethernet port socket-plug pair connections on the mixed signal communication channels and lowering the insertion loss of the multi-port protection system.

27. The surge suppression system as in claim 23, wherein said multi-port protection system is directly connectable to multiport commercial devices and is interoperable with different modes Power over Ethernet and wherein said multi-port protection system provides conductive connections for the shielding of network connecting cables to a chassis ground of a multiport device.

28. The surge suppression system as in claim 23, wherein said multi-port protection system provides mitigation of differential mode and common mode electromagnetic interference in mixed signal communication channels supporting multimode Power over Ethernet, respectively, forming a multi-port multimode protection system.

29. The surge suppression system as in claim 28, wherein said multi-port protection system is directly connectable to a multiport commercial device supporting said multimode Power over Ethernet and wherein said multi-port multimode protection system provides interlocking Ethernet plugs and secure mechanical bracket for connecting to a multiport device.

30. The surge suppression system as in claim 29, wherein said multi-port multimode protection system is directly connectable to multiport devices with Power over Ethernet having Ethernet port plugs pressed-connected to semi-flexible edge segments of a printed circuit board of the multi-port protection system providing straight line connectivity to contact pins of a respective plug, eliminating the need for soldering of the contact pins of said respective plug and minimizing impedance changes of the network mixed signal communication channels.

31. The surge suppression system as in claim 28, wherein said multi-port multimode protection system is directly connectable to a multiport device with mixed signal communication channels carrying data and direct current power and wherein said multiport device has commercial and custom-made ports, including single pair Power over Ethernet, which are respectively matched with the input and output connectors of said multi-port multimode protection system.

32. The surge suppression system as in claim 28, wherein said multi-port multimode protection system is operational in network with data communication channels not carrying direct current power and wherein said multi-port multimode protection system can be connected to multiport devices which do not support Power over Ethernet.

\* \* \* \* \*